(12) United States Patent
Kanzian et al.

(10) Patent No.: US 12,199,628 B2
(45) Date of Patent: Jan. 14, 2025

(54) CALIBRATION SYSTEM AND METHOD FOR SAR ADCS

(71) Applicant: Infineon Technologies AG, Neubiberg (DE)

(72) Inventors: Marc Kanzian, Wernberg (AT); Alan Paussa, Villach (AT); Francesco Conzatti, Villach (AT); Joseph Semmler, Muehlhausen (DE)

(73) Assignee: Infineon Technologies AG, Neubiberg (DE)

(*) Notice: Subject to any disclaimer, the term of this patent is extended or adjusted under 35 U.S.C. 154(b) by 170 days.

(21) Appl. No.: 18/047,896

(22) Filed: Oct. 19, 2022

(65) Prior Publication Data

US 2024/0137033 A1    Apr. 25, 2024
US 2024/0235567 A9    Jul. 11, 2024

(51) Int. Cl.
*H03M 1/10* (2006.01)
*H03M 1/38* (2006.01)
*H03M 1/46* (2006.01)

(52) U.S. Cl.
CPC ....... *H03M 1/1009* (2013.01); *H03M 1/1014* (2013.01); *H03M 1/1042* (2013.01);
(Continued)

(58) Field of Classification Search
CPC .... H03M 1/1009; H03M 1/38; H03M 1/1042; H03M 1/466
(Continued)

(56) References Cited

U.S. PATENT DOCUMENTS 10,483,995 B1 *  11/2019  Lok ............... H03M 1/1042
10,742,225 B1 *   8/2020  Molina .......... H03M 1/1033
2021/0203338 A1   7/2021  Molina

OTHER PUBLICATIONS

Zhang, Panpan et al., "A 16-bit 1-MS/s Pseudo-Differential SAR ADC With Digital Calibration and DNL Enhancement Achieving 92 dB SNDR", IEEE Access, Aug. 26, 2019, 15 pages.

* cited by examiner

*Primary Examiner* — Khai M Nguyen
(74) *Attorney, Agent, or Firm* — Slater Matsil, LLP

(57) ABSTRACT

In accordance with an embodiment, a method for operating a successive approximation ADC comprising a first capacitor array includes measuring a first weight of an MSB-$a^{th}$ bit of the ADC by applying a first reference voltage to first terminals of capacitors of the first capacitor array corresponding to the MSB-$a^{th}$ bit, applying a second reference voltage to first terminals of capacitors of the first capacitor array corresponding to significant bits lower than the MSB-$a^{th}$ bit, applying the first reference voltage to first terminals of a first set of capacitors of the first capacitor array corresponding to significant bits higher than the MSB-$a^{th}$ bit, and applying the second reference voltage to first terminals of a second set of capacitors of the first capacitor array corresponding to the significant bits higher than the MSB-$a^{th}$ bit; subsequently, a weight of a capacitance of the capacitors corresponding to the MSB-$a^{th}$ bit is successively approximated.

22 Claims, 16 Drawing Sheets

(52) U.S. Cl.
CPC ............. *H03M 1/38* (2013.01); *H03M 1/462* (2013.01); *H03M 1/466* (2013.01)

(58) Field of Classification Search
USPC .......................................... 341/118, 120, 172
See application file for complete search history.

| Redundant Bit | Weight in unit caps | Normalized weight |
|---|---|---|
| 12 | 111 | 1776 |
| 11 | 64 | 1024 |
| 10 | 36 | 576 |
| 9 | 20 | 320 |
| 8 | 11 | 176 |
| 7 | 6 | 96 |
| 6 | 4 | 64 |
| 5 | 2 | 32 |
| 4 | 1 | 16 |
| 3 | 0.5 | 8 |
| 2 | 0.25 | 4 |
| 1 | 0.125 | 2 |
| 0 | 0.0625 | 1 |
| | total number of levels | 4096 => 12 effective bits |

*Fig. 2B*

| Bit | Weight in unit caps | Normalized weight |
|---|---|---|
| 11 | 128 | 2048 |
| 10 | 64 | 1024 |
| 9 | 32 | 512 |
| 8 | 16 | 256 |
| 7 | 8 | 128 |
| 6 | 4 | 64 |
| 5 | 2 | 32 |
| 4 | 1 | 16 |
| 3 | 0.5 | 8 |
| 2 | 0.25 | 4 |
| 1 | 0.125 | 2 |
| 0 | 0.0625 | 1 |
| | total number of levels | 4096 => 12 effective bits |

*Fig. 2C*

| Cycle | SARP<12:0> (MSB->LSB) | | | | | | | | | | | | |
|---|---|---|---|---|---|---|---|---|---|---|---|---|---|
| 0 (Initial) | 0 | 0 | 0 | 0 | 0 | 0 | 0 | 0 | 0 | 0 | 0 | 0 | 0 |
| 1 | C[12] | 0 | 0 | 0 | 0 | 0 | 0 | 0 | 0 | 0 | 0 | 0 | 0 |
| 2 | C[12] | C[11] | 0 | 0 | 0 | 0 | 0 | 0 | 0 | 0 | 0 | 0 | 0 |
| 3 | C[12] | C[11] | C[10] | 0 | 0 | 0 | 0 | 0 | 0 | 0 | 0 | 0 | 0 |
| 4 | C[12] | C[11] | C[10] | C[9] | 0 | 0 | 0 | 0 | 0 | 0 | 0 | 0 | 0 |
| 5 | C[12] | C[11] | C[10] | C[9] | C[8] | 0 | 0 | 0 | 0 | 0 | 0 | 0 | 0 |
| 6 | C[12] | C[11] | C[10] | C[9] | C[8] | C[7] | 0 | 0 | 0 | 0 | 0 | 0 | 0 |
| 7 | C[12] | C[11] | C[10] | C[9] | C[8] | C[7] | C[6] | 0 | 0 | 0 | 0 | 0 | 0 |
| 8 | C[12] | C[11] | C[10] | C[9] | C[8] | C[7] | C[6] | C[5] | 0 | 0 | 0 | 0 | 0 |
| 9 | C[12] | C[11] | C[10] | C[9] | C[8] | C[7] | C[6] | C[5] | C[4] | 0 | 0 | 0 | 0 |
| 10 | C[12] | C[11] | C[10] | C[9] | C[8] | C[7] | C[6] | C[5] | C[4] | C[3] | 0 | 0 | 0 |
| 11 | C[12] | C[11] | C[10] | C[9] | C[8] | C[7] | C[6] | C[5] | C[4] | C[3] | C[2] | 0 | 0 |
| 12 | C[12] | C[11] | C[10] | C[9] | C[8] | C[7] | C[6] | C[5] | C[4] | C[3] | C[3] | C[1] | 0 |
| 13 (Final) | C[12] | C[11] | C[10] | C[9] | C[8] | C[7] | C[6] | C[5] | C[4] | C[3] | C[3] | C[1] | C[0] |

*Fig. 2D*

| Cycle | SARN<12:0> (MSB->LSB) | | | | | | | | | | | | |
|---|---|---|---|---|---|---|---|---|---|---|---|---|---|
| 0 (Initial) | 0 | 0 | 0 | 0 | 0 | 0 | 0 | 0 | 0 | 0 | 0 | 0 | 0 |
| 1 | !C[12] | 0 | 0 | 0 | 0 | 0 | 0 | 0 | 0 | 0 | 0 | 0 | 0 |
| 2 | !C[12] | !C[11] | 0 | 0 | 0 | 0 | 0 | 0 | 0 | 0 | 0 | 0 | 0 |
| 3 | !C[12] | !C[11] | !C[10] | 0 | 0 | 0 | 0 | 0 | 0 | 0 | 0 | 0 | 0 |
| 4 | !C[12] | !C[11] | !C[10] | !C[9] | 0 | 0 | 0 | 0 | 0 | 0 | 0 | 0 | 0 |
| 5 | !C[12] | !C[11] | !C[10] | !C[9] | !C[8] | 0 | 0 | 0 | 0 | 0 | 0 | 0 | 0 |
| 6 | !C[12] | !C[11] | !C[10] | !C[9] | !C[8] | !C[7] | 0 | 0 | 0 | 0 | 0 | 0 | 0 |
| 7 | !C[12] | !C[11] | !C[10] | !C[9] | !C[8] | !C[7] | !C[6] | 0 | 0 | 0 | 0 | 0 | 0 |
| 8 | !C[12] | !C[11] | !C[10] | !C[9] | !C[8] | !C[7] | !C[6] | !C[5] | 0 | 0 | 0 | 0 | 0 |
| 9 | !C[12] | !C[11] | !C[10] | !C[9] | !C[8] | !C[7] | !C[6] | !C[5] | !C[4] | 0 | 0 | 0 | 0 |
| 10 | !C[12] | !C[11] | !C[10] | !C[9] | !C[8] | !C[7] | !C[6] | !C[5] | !C[4] | !C[3] | 0 | 0 | 0 |
| 11 | !C[12] | !C[11] | !C[10] | !C[9] | !C[8] | !C[7] | !C[6] | !C[5] | !C[4] | !C[3] | !C[2] | 0 | 0 |
| 12 | !C[12] | !C[11] | !C[10] | !C[9] | !C[8] | !C[7] | !C[6] | !C[5] | !C[4] | !C[3] | !C[2] | !C[1] | 0 |
| 13 (Final) | !C[12] | !C[11] | !C[10] | !C[9] | !C[8] | !C[7] | !C[6] | !C[5] | !C[4] | !C[3] | !C[2] | !C[1] | !C[0] |

*Fig. 2E*

| bit | weight | calib MSB m5 | calib MSB m4 | calib MSB m3 | calib MSB m2 | calib MSB m1 | calib MSB m0 | Nominal |
|---|---|---|---|---|---|---|---|---|
| 12 | 111 | | | | | | 222 | |
| 11 | 64 | | | | | 128 | | |
| 10 | 36 | | | | 72 | | | |
| 9 | 20 | | | 40 | | | | |
| 8 | 11 | | 22 | | | | | |
| 7 | 6 | 12 | | | | | | |
| 6 | 4 | | | | | | | |
| 5 | 2 | | | | | | | |
| 4 | 1 | | | | | | | |
| 3 | 0.5 | | | | | | | |
| 2 | 0.25 | | | | | | | |
| 1 | 0.25 | | | | | | | |
| sum | 256 | 12 | 22 | 40 | 72 | 128 | 222 | 256 |
| Delta CDAC/4 | | -244 | -234 | -216 | -184 | -128 | -34 | 0 |
| Delta CDAC/4 [%] | | -95.31 | -91.41 | -84.38 | -71.88 | -50 | -13.28 | 0 |

Fig. 4A

| bit | weight | calib MSB m5 | calib MSB m4 | calib MSB m3 | calib MSB m2 | calib MSB m1 | calib MSB m0 | Nominal |
|---|---|---|---|---|---|---|---|---|
| 12 | 111 | 111 | 111 | 111 | 111 | 111 | 222 | |
| 11 | 64 | 64 | 64 | 64 | 64 | 128 | | |
| 10 | 36 | 36 | 36 | 36 | 72 | | | |
| 9 | 20 | 20 | 20 | 40 | | | | |
| 8 | 11 | 11 | 22 | | | | | |
| 7 | 6 | 12 | | | | | | |
| 6 | 4 | | | | | | | |
| 5 | 2 | | | | | | | |
| 4 | 1 | | | | | | | |
| 3 | 0.5 | | | | | | | |
| 2 | 0.25 | | | | | | | |
| 1 | 0.25 | | | | | | | |
| sum | 256 | 254 | 253 | 251 | 247 | 239 | 222 | 256 |
| Delta CDAC/4 | | -2 | -3 | -5 | -9 | -17 | -34 | 0 |
| Delta CDAC/4 [%] | | -0.78 | -1.17 | -1.95 | -3.52 | -6.64 | -13.28 | 0 |

Fig. 4B

| bit | weight | calib MSB m5 | calib MSB m4 | calib MSB m3 | calib MSB m2 | calib MSB m1 | calib MSB m0 | Nominal |
|---|---|---|---|---|---|---|---|---|
| 12 | 111 | 111 | 111 | 111 | 111 | 111 | 222 | |
| 11 | 64 | 64 | 64 | 64 | 64 | 128 | | |
| 10 | 36 | 36 | 36 | 36 | 72 | | | |
| 9 | 20 | 20 | 20 | 40 | | | 20 | |
| 8 | 11 | 11 | 22 | | | | | |
| 7 | 6 | 12 | | | | | | |
| 6 | 4 | | | | | | | |
| 5 | 2 | | | | | | | |
| 4 | 1 | | | | | | | |
| 3 | 0.5 | | | | | | | |
| 2 | 0.25 | | | | | | | |
| 1 | 0.25 | | | | | | | |
| sum | 256 | 254 | 253 | 251 | 247 | 239 | 242 | 256 |
| Delta CDAC/4 | | -2 | -3 | -5 | -9 | -17 | -14 | 0 |
| Delta CDAC/4 [%] | | -0.78 | -1.17 | -1.95 | -3.52 | -6.64 | -5.47 | 0 |

Fig. 4C

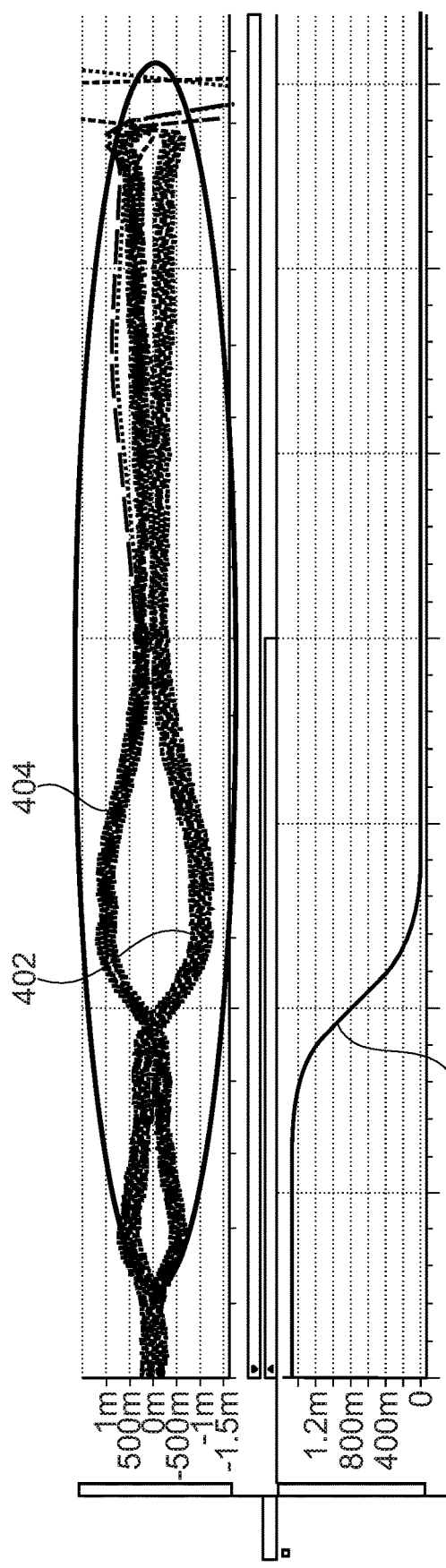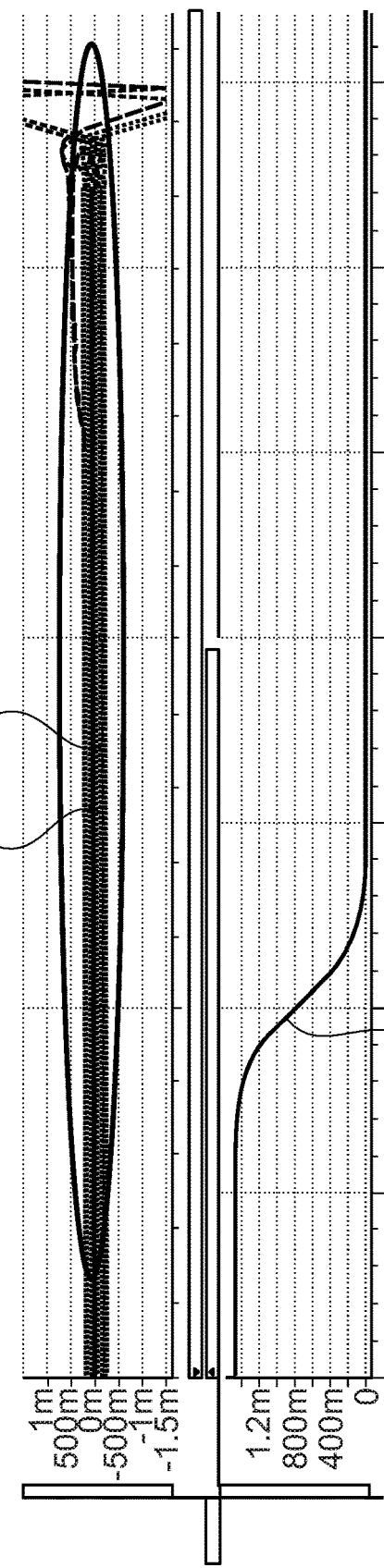
Fig. 4D
Fig. 4E

| bit | weight | calib MSBm5 | calib MSBm4 | calib MSBm3 | calib MSBm2 | calib MSBm1 | calib MSBm0 | Nominal |
|---|---|---|---|---|---|---|---|---|
| 12 | 111 | 222 | 222 | 222 | 222 | 222 | 222 | |
| 11 | 64 | | | | | 128 | | |
| 10 | 36 | | | | 72 | | | |
| 9 | 20 | | | 40 | | | | |
| 8 | 11 | 22 | 22 | | | 22 | | |
| 7 | 6 | 12 | | | | | | |
| 6 | 4 | | | | | | | |
| 5 | 2 | | | | | | | |
| 4 | 1 | | | | | | | |
| 3 | 0.5 | | | | | | | |
| 2 | 0.25 | | | | | | | |
| 1 | 0.25 | | | | | | | |
| sum | 256 | 256 | 244 | 262 | 294 | 350 | 244 | 256 |
| Delta CDAC/4 | | 0 | -12 | 6 | 38 | 94 | -12 | 0 |
| Delta CDAC/4 [%] | | 0 | -4.69 | 2.34 | 14.84 | 36.72 | -4.69 | 0 |

*Fig. 5C*

| bit | weight | calib MSBm5 | calib MSBm4 | calib MSBm3 | calib MSBm2 | calib MSBm1 | calib MSBm0 | Nominal |
|---|---|---|---|---|---|---|---|---|
| 12 | 111 | 222 | | | | 222 | 222 | |
| 11 | 64 | | 128 | 128 | 128 | 128 | | |
| 10 | 36 | | 72 | 72 | 72 | | | |
| 9 | 20 | | 40 | 40 | | | | |
| 8 | 11 | 22 | 22 | | | | | |
| 7 | 6 | 12 | | | | | | |
| 6 | 4 | | | | | | | |
| 5 | 2 | | | | | | | |
| 4 | 1 | | | | | | | |
| 3 | 0.5 | | | | | | | |
| 2 | 0.25 | | | | | | | |
| 1 | 0.25 | | | | | | | |
| sum | 256 | 256 | 262 | 240 | 200 | 350 | 222 | 256 |
| Delta CDAC/4 | | 0 | 6 | -16 | -56 | 94 | -34 | 0 |
| Delta CDAC/4 [%] | | 0 | 2.34 | -6.25 | -21.88 | 36.72 | -13.28 | 0 |

*Fig. 5D*

CALIBRATION SYSTEM AND METHOD FOR SAR ADCS

TECHNICAL FIELD

The present invention relates generally to a system and method for a successive approximation analog-to-digital converter (ADC).

BACKGROUND

Successive approximation ADCs convert an analog input to a digital output word by estimating the value of the analog signal using a digital-to-analog converter (DAC). Over the course of a number of successive approximation cycles, a series of digital estimates are provided to the input of the DAC. During each successive approximation cycle, the output of the DAC is compared to the analog input signal, and the result of each comparison is used to provide a closer estimate for the next estimation or successive approximation cycle. In many successive approximation ADCs, a binary search algorithm is used to perform the analog-to-digital conversion, such that each bit of the ADC output word corresponds to a particular estimation or successive approximation cycle.

Due to its relative low power consumption and simple architecture, successive approximation ADCs are increasingly used in many electronic systems for a variety of different purposes. They may be used, for example, to measure DC voltages and currents in power supply applications, to digitize microphone signals in audio applications, or to digitize downconverted RF signals in RF communication and radar systems.

Successive approximation ADCs, however, may be prone to non-linearities due to mismatch in the reference elements used to construct the DAC used to estimate the input voltage. For example, device mismatch in a capacitor array of a charge redistribution DAC may cause the ADC transfer function to deviate from a linear characteristic. This non-linearity may manifest itself as differential non-linearity (DNL) or integral non-linearity (INL). In systems that utilize successive approximation ADCs to convert AC signals, such as radar or audio signals, the nonlinearities of the ADC may cause unwanted spurious tones.

SUMMARY

In accordance with an embodiment, a method for operating a successive approximation ADC comprising a first capacitor array includes measuring a first weight of an MSB-$a^{th}$ bit of the ADC. Measuring the first weight includes performing a first sampling operation that includes: applying a first reference voltage to first terminals of capacitors of the first capacitor array corresponding to the MSB-$a^{th}$ bit, applying a second reference voltage to first terminals of capacitors of the first capacitor array corresponding to significant bits lower than the MSB-$a^{th}$ bit, applying the first reference voltage to first terminals of a first set of capacitors of the first capacitor array corresponding to significant bits higher than the MSB-$a^{th}$ bit, and applying the second reference voltage to first terminals of a second set of capacitors of the first capacitor array corresponding to the significant bits higher than the MSB-$a^{th}$ bit; and successively approximating a weight of a capacitance of the capacitors corresponding to the MSB-$a^{th}$ bit after performing the first sampling operation.

In accordance with another embodiment, a method for operating a successive approximation ADC comprising a first capacitor array includes measuring a first weight of an MSB-$a^{th}$ bit of the ADC. Measuring the first weight includes performing a first sampling operation that includes: applying a first reference voltage to first terminals of capacitors of the first capacitor array corresponding to the MSB-$a^{th}$ bit, applying the first reference voltage to first terminals of a first set of capacitors of the first capacitor array corresponding to other bits besides the MSB-$a^{th}$ bit, and applying a second reference voltage to first terminals of a second set of capacitors of the first capacitor array corresponding to other bits besides the MSB-$a^{th}$ bit; and successively approximating a weight of a capacitance of the capacitors corresponding to the MSB-$a^{th}$ bit after performing the first sampling operation while continuing to apply the first reference voltage to first terminals of a first set of capacitors of the first capacitor array corresponding to other bits besides the MSB-$a^{th}$ bit.

In accordance with another embodiment, a method for operating a successive approximation ADC comprising a first capacitor array includes: measuring a plurality of capacitances of the ADC, where each capacitance corresponds to a different combination of bits of the ADC, and measuring each capacitance of the plurality of capacitances includes applying a first reference voltage to first terminals of capacitors of the first capacitor array corresponding to a plurality of bits of the ADC corresponding to the respective combination of bits, and applying a second reference voltage to first terminals of capacitors of the first capacitor array that do not correspond the plurality of bits of the ADC corresponding to the respective combination of bits; successively approximating a capacitance of the capacitors of the first capacitor array corresponding to the plurality of bits of the ADC corresponding to the respective combination of bits; and calculating a capacitance weight corresponding to each bit of the ADC based on the measured plurality of capacitances.

In accordance with a further embodiment, an analog-to-digital converter (ADC) includes: a first capacitor array; a plurality of switches coupled to the first capacitor array; a comparator coupled to the first capacitor array; and a controller comprising a successive approximation register and configured to measure a first weight of an MSB-$a^1$ bit of the ADC. The controller is configured to measure a first weight of an MSB-$a^h$ bit of the ADC by configuring the first capacitor array in a first sampling configuration in which a first reference voltage is coupled to first terminals of capacitors of the first capacitor array corresponding to the MSB-$a^{th}$ bit, and to first terminals of a first set of capacitors of the first capacitor array corresponding to significant bits higher than the MSB-$a^{th}$ bit, and a second reference voltage is coupled to first terminals of capacitors of the first capacitor array corresponding to significant bits lower than the MSB-$a^{th}$ bit, and to first terminals of a second set of capacitors of the first capacitor array corresponding to the significant bits higher than the MSB-$a^{th}$ bit; and successively approximating a weight of a capacitance of the capacitors corresponding to the MSB-$a^{th}$ bit based on feedback from the comparator after the first capacitor array has been arranged in the first sampling configuration to obtain a first capacitance weight.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2B, 2C, 2D and 2E are tables illustrating the operation of an embodiment successive approximation ADC.

FIG. 4A illustrates a table showing an exemplary sampling configuration; FIGS. 4B and 4C illustrate tables showing embodiment sampling configurations; FIGS. 4D, 4E, 4F, 4G and 4H illustrate waveform diagrams and graphs that compare the performance of an exemplary SAR ADC with an embodiment SAR ADC;

FIGS. 5C and 5D illustrate tables showing sampling configurations according to alternative embodiments;

Figure 1:
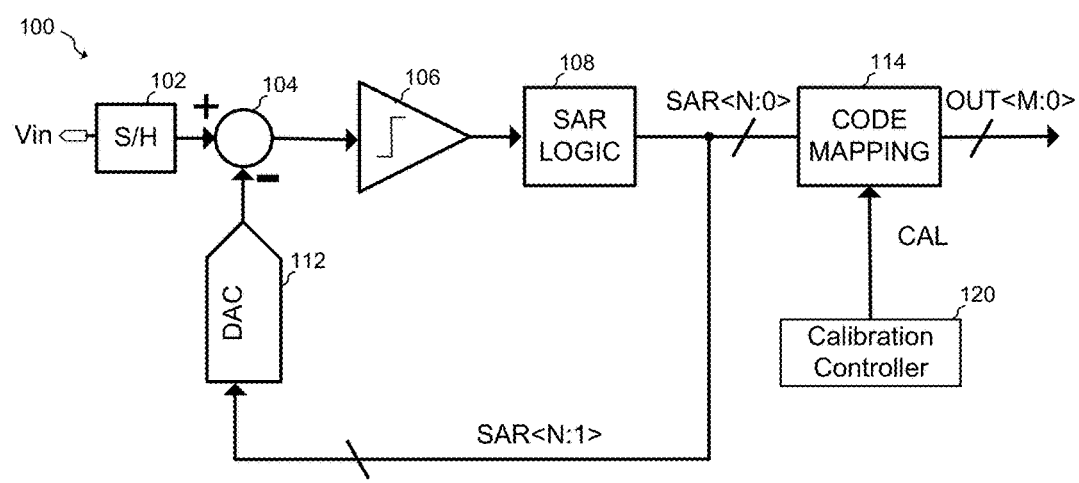
FIG. 1 illustrates a block diagram of an embodiment successive approximation ADC (SAR ADC)

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In accordance with an embodiment, a successive approximation (SAR) ADC is disclosed in which the effect of non-linearities due to mismatch of DAC reference elements is reduced by measuring the respective weights of one or more DAC reference elements, and using the measured weight to correct the output of the SAR ADC.

In embodiments directed to a switched-capacitor array, the weight of one or more DAC reference elements is measured by performing a sampling operation on measured DAC reference elements followed by performing a successive approximation of the value of the sampled DAC reference elements.

During the sampling operation, terminals of capacitors of the switched-capacitor array corresponding to measured DAC reference elements are coupled to one or more reference voltages according to a first configuration, terminals of capacitors of the switched-capacitor array corresponding to DAC reference elements associated with lower MSBs than the measured DAC reference elements are coupled to the reference voltages according to a second configuration, and terminals of capacitors of the switched-capacitor array corresponding to the DAC reference elements associated with higher MSBs than the measured DAC reference elements (if applicable) are coupled to the reference voltages according to a third configuration. The first, second and third configurations are chosen to balance the number of capacitors coupled to the various reference voltages during the sampling operation.

For example, in one embodiment, all of the capacitors of the switched-capacitor array corresponding to the measured DAC reference elements are coupled to a first reference voltage (e.g., the first configuration), and all of the capacitors of the switched-capacitor array corresponding to the DAC reference elements associated with lower MSBs than the measured DAC reference elements are coupled to a second reference voltage (e.g., the second configuration). Half of the remaining capacitors of the switched-capacitor array corresponding to the DAC reference elements associated with higher MSBs than the measured DAC reference element (if applicable) are coupled to the first reference voltage, while the other half are connected to the second reference voltage (e.g., the third configuration). For differential SAR ADCs that utilize a split CDAC architecture, the first switched-capacitor array is coupled as described above, while the second switched-capacitor array is coupled in an opposite manner (e.g., by swapping the first reference voltage and the second reference voltage).

During the successive approximation operation, the connections to the capacitors of the switched-capacitor array corresponding to the DAC reference elements associated with higher MSBs than the measured DAC reference element may be "frozen." In other words, the same connections to the capacitors established during the sampling operation is maintained during the successive approximation operation, and are not modified as a result of comparisons made during the successive approximation operation. As such, DAC reference elements are measured as a function of the capacitors in the switched-capacitor array that represent MSBs lower than the bit being measured.

When the capacitor array transitions from its sampling phase configuration to its successive approximation configuration, there may be a transient on the common node of the switched-capacitor array. The amplitude of this transient is related to the degree by which the reference voltage connections to the capacitors in the switched-capacitor array are balanced (e.g., the degree to which the capacitance coupled to the first reference voltage matches the capacitance coupled to the second reference voltage). This voltage transient can cause a measurement error during the calibration of the SAR ADC, which results in a calibration error the degrades the distortion performance and spurious free dynamic range (SFDR) of the SAR ADC. Errors caused by such transients are further exacerbated by dielectric absorption of capacitors of the switched capacitor array, which causes a memory effect between consecutive measurements.

By operating the SAR ADCs in a manner that balances the capacitance of the capacitor array to its respective reference voltage, voltage transients and offsets seen on the common node of the switched-capacitor array are significantly reduced. This advantageously results in more accurate calibration measurements and increased SFDR for the SAR ADC. In addition, measurement error caused by dielectric absorption of capacitors of the switched capacitor array is significantly reduced.

In the following description, the general operation of embodiment SAR ADCs is described with respect to FIGS. 1 and 2A-2F. Specific examples of embodiment calibration systems and methods is described with respect to FIGS. 3A-3C, 4A-4H, 5A-5D and 6. Non-limiting examples of systems that use embodiments SAR ADCs is described with respect to FIGS. 7A and 7B.

Turning to FIG. 1, a successive approximation ADC 100 according to an embodiment of the present invention is shown. ADC 100 includes a sample and hold circuit 102, a summing circuit 104, comparator 106, SAR 108 (also referred to as a "successive approximation register (SAR)"), a code mapping circuit 114, and a digital-to-analog converter (DAC) 112. In some embodiments, DAC 112 is implemented as a sub-binary DAC.

During operation, sample and hold circuit 102 samples input voltage Vin to form a sampled input signal. Next, in a series of successive approximation cycles, SAR 108 working in conjunction with DAC 112, successively approximates input voltage Vin. When each conversion is complete, code mapping circuit 114 converts the output word SAR<N:0> of SAR logic 108 to a corrected binary code OUT<M:0> based on calibration values CAL, that corrects for nonlinearities of DAC 112. In embodiments in which DAC 112 is implemented as a sub-binary DAC, code mapping circuit 114 also maps the sub-binary output of SAR logic 108 to a corrected binary value.

In various embodiments, in a first successive approximation cycle, SAR 108 sets SAR<N:0> to a predetermined state. In some embodiments, setting SAR<N:0> may entail setting all of the bits of SAR<N:0> to zero. Alternatively, the most significant bit SAR<N> of SAR<N:0> may be set to a first state (e.g., one), and the remaining bits of SAR<N:0> may be set to a second state different from the first state (e.g., zero). In further embodiments, the initial state of SAR<N:0> may be different from these examples depending on the particular embodiment and its specifications. Summing circuit 104 subtracts the output of DAC 112 from the output of sample and hold circuit 102 and passes the resultant error to comparator 106. The output of comparator 106 is indicative of whether the first estimate provided by DAC 112 is less than or greater than the sampled voltage produced by sample and hold circuit 102.

In one embodiment, for example an embodiment in which all bits of SAR<N:0> are initially set to zero, if the output of comparator 106 indicates that the output of DAC 112 overestimated the sampled voltage, SAR 108 keeps the most significant bit SAR<N> to zero, and keeps the remaining bits SAR<N-1:0> at zero. If, on the other hand, the output of comparator 106 indicates that the output of DAC 112 underestimated the sampled voltage, SAR 108 sets the most significant bit SAR<N> to one and keeps the remaining bits SAR<N-1:0> at zero. As such, the value of the bit corresponding the bit being determined as well as the next state of DAC 112 is based on feedback from comparator 106. Operation of ADC 100 proceeds bit by bit on a similar basis until the sampled input voltage is more closely estimated by the output of DAC 112.

In other embodiments, operation of SAR 108 may proceed in a different manner. For example, in an embodiment in which the most significant bit SAR<N> is set to one and the remaining bits SAR<N-1:0> are initially set to zero, if the output of comparator 106 indicates that the output of DAC 112 overestimated the sampled voltage, SAR 108 sets the most significant bit SAR<N> to zero, sets the next most significant bit SAR<N-1> to one, and then sets the remaining bits SAR<N-2:0> to zero. If, on the other hand, the output of comparator 106 indicates that the output of DAC 112 underestimated the sampled voltage, SAR 108 sets the most significant bit SAR<N> to one, sets the next most significant bit SAR<N-1> to one, and then sets the remaining bits SAR<N-2:0> to zero. Operation of ADC 100 proceeds bit by bit on a similar basis until the sampled input voltage is more closely estimated by the output of DAC 112.

It should be appreciated that the aforementioned successive approximation methods are just a small number of examples of many possible successive approximation methods that could be applied to embodiments of the present invention. In alternative embodiments, other successive approximation methods that successively approximate the sampled input voltage in a closed loop manner could be used.

During operation, a number of non-idealities may affect the performance of ADC 100. For example, when the most significant bit SAR<N> is being evaluated, settling time errors, offset errors and noise within summing circuit 104 and comparator 106 may create a situation in which the successive approximation cycles produces an incorrect estimate. Such an incorrect estimate may result in nonlinearities with respect to the relationship between input voltage Vin and the output code out <M:0>.

One way in which errors resulting from long settling times, offsets and noise may be addressed is by using a successive approximation ADC architecture known as a redundant successive approximation ADC architecture. In such an architecture, DAC 112 is constructed using sub-binary weighted reference elements that result in regions in which the DAC 112 has redundant codes. In some embodiments of the present invention, DAC 112 may be implemented using sub-binary weighted reference elements that result in redundant code regions where a plurality of DAC input codes map to a single DAC output value of a DAC output signal. In some embodiments, the sub-binary weighted elements may have repeated weights, for example, [8, 4, 2, 2, 1]. Alternatively, any combination of repeated weights may be used for all of the embodiments described herein. Because of these redundant code regions, errors in the bits corresponding to the sub-binary weighted reference elements can be corrected during subsequent successive approximation cycles. In such embodiments, the resulting output code SAR<N: 0> may not result in a properly scaled binary representation of input voltage Vin that is usable by further processing circuits. As such, code mapping circuit 114 may be used to map sub-binary weighed code SAR<N: 0> to a binary weighted output value out <M:0> as explained further below.

In order to represent 4096 output levels, a 12-bit DAC having binary weighted reference elements might have relative assigned weights $W_{11}$ to $W_0$ of: $W_{11}=2048$; $W_{10}=1024$; $W_9=512$; $W_8=256$; $W_7=128$; $W_6=64$; $W_5=32$; $W_4=16$; $W_3=8$; $W_2=4$; $W_1=2$; and $W_0=1$, such that the output level is $D_{11}W_{11}+D_{10}W_{10}+D_9\ W_{10}+D_9\ W_9+D_8W_8+D_7\ W_7+D_6\ W_6+D_5\ W_5+D_4\ W_4+D_3\ W_3+D_2\ W_2+D_1\ W_1+D_0W_0$, and $D_{11}$ to $D_0$ is the input data word to the DAC.

In one example embodiment, in order to represent 4096 output levels, DAC 112 is implemented using a redundantly coded DAC having 13 bits with the following relative assigned weights $W_{12}$ to $W_0$ of: $W_{12}=1776$; $W_1=1024$; $W_{10}=576$; $W_9=320$; $W_8=176$; $W_7=96$; $W_6=64$; $W_5=32$; $W_4=16$; $W_3=8$; $W_2=4$; $W_1=2$; $W_0=1$, such that the output level is $D_{12}W_{12}+D_{11}W_{11}+D_{10}W_{10}+D_9\ W_{10}+D_9\ W_9+D_8W_8+D_7\ W_7+D_6\ W_6+D_5\ W_5+D_4\ W_4+D_3\ W_3+D_2\ W_2+D_1\ W_1+D_0W_0$, and $D_{12}$ to $D_0$ is the input data word to DAC 112. In this example, weights $W_{12}$ to $W_7$ are arranged in a sub-binary manner with respect to each other, while remaining weights $W_7$ to $W_0$ are related to each other in a binary fashion. It should be understood that in alternative embodiments, all weights could be related to each other in a sub-binary fashion or the allocation of sub-binary weights and binary weights could be different from the example shown.

In various embodiments, each of the weights $W_{12}$ to $W_0$ represents a reference element in the structure of DAC 112. For example, in a charge redistribution DAC, weights $W_{12}$ to $W_0$ may represent the relative sizes of capacitors used within the charge redistribution DAC.

When SAR output word SAR<N: 0> of SAR 108 is sub-binary weighted, code mapping circuit 114 is configured to convert SAR output word SAR<N: 0> to output word OUT<M:0> having a binary representation. In some embodiments, code mapping circuit 114 is configured to multiply each bit of SAR<N: 0> with its corresponding relative weight and add each weighted result together. For example, code mapping circuit may be configured to perform the following calculation:

SAR<12>*$W_{12}$+SAR<11>*$W_{11}$+SAR<10>*$W_{10}$+
SAR<9>*$W_9$+SAR<8>*$W_8$+SAR<7>*$W_7$+
SAR<6>*$W_6$+SAR<5>*$W_5$+SAR<4>*$W_4$+
SAR<3>*$W_3$+SAR<2>*$W_2$+SAR<1>*$W_1$+
SAR<0>*$W_0$.

The above calculation may be performed digitally using circuits and methods known in the art. For example, in some embodiments, a lookup table could be employed. Alternatively, each term of the equation above could be accumulated on a bit-by-bit basis during each successive approximation cycle. For example, at the end of the first successive approximation cycle, the quantity SAR<12>*$W_{12}$ could be calculated and stored in an accumulator; at the end of the second successive approximation cycle, SAR<11>*$W_{11}$ could be calculated and then accumulated with the previous result, and so on until the conversion is complete. In further embodiments, other methods of converting a sub-binary weighted word to a binary representation could be employed to implement code mapping circuit 114.

As mentioned above code mapping circuit 114 is also configured to correct errors in the weighting of the reference elements of DAC 112. In order to do this, the actual weights of one or more reference elements of DAC 112 are measured using ADC 100. For example, in various embodiments, a reference element that corresponds to the MSB-$a^{th}$ of the DAC is estimated in terms of reference elements corresponding to bit that are lower than the MSB-$a^{th}$ of the DAC, where a=0 to n−2, where n is the number of bits of ADC 100. For example, for the MSB of ADC 100, a=0, so the weight of the MSB-$0^{th}$ reference element may be estimated using DAC reference elements corresponding to the MSB-$a^{th}$ bits of the ADC where a may have values between 1 and n. As another example, for the second most MSB (e.g., the MSB-$1^{st}$ bit) of the ADC, the weight may be estimated using DAC reference elements corresponding to the MSB-$a^{th}$ bits of the ADC where a may have values between 2 and n.

One or more of the DAC weights may be estimated using foreground calibration during a calibration sequence. In one embodiment, input Vin is coupled to a reference voltage, such as ground or VDD/2, the MSB-$a^{th}$ bit DAC 112 is asserted, and a successive approximation is performed using SAR 108 in conjunction with DAC 112 to measure/estimate the actual weight of the reference element associated with the MSB-$a^{th}$ bit. The measured weight is then used by code mapping circuit 114 to map the output of SAR logic 108 to a binary code during normal operation of the ADC. In various embodiments, the calibration sequence is controlled by calibration controller 120. Each of the measured/estimated weights may be written to a memory location of a memory within code mapping circuit 114 by calibration controller 120. In some embodiments, these memory locations form lookup table entries.

Figure 2A:
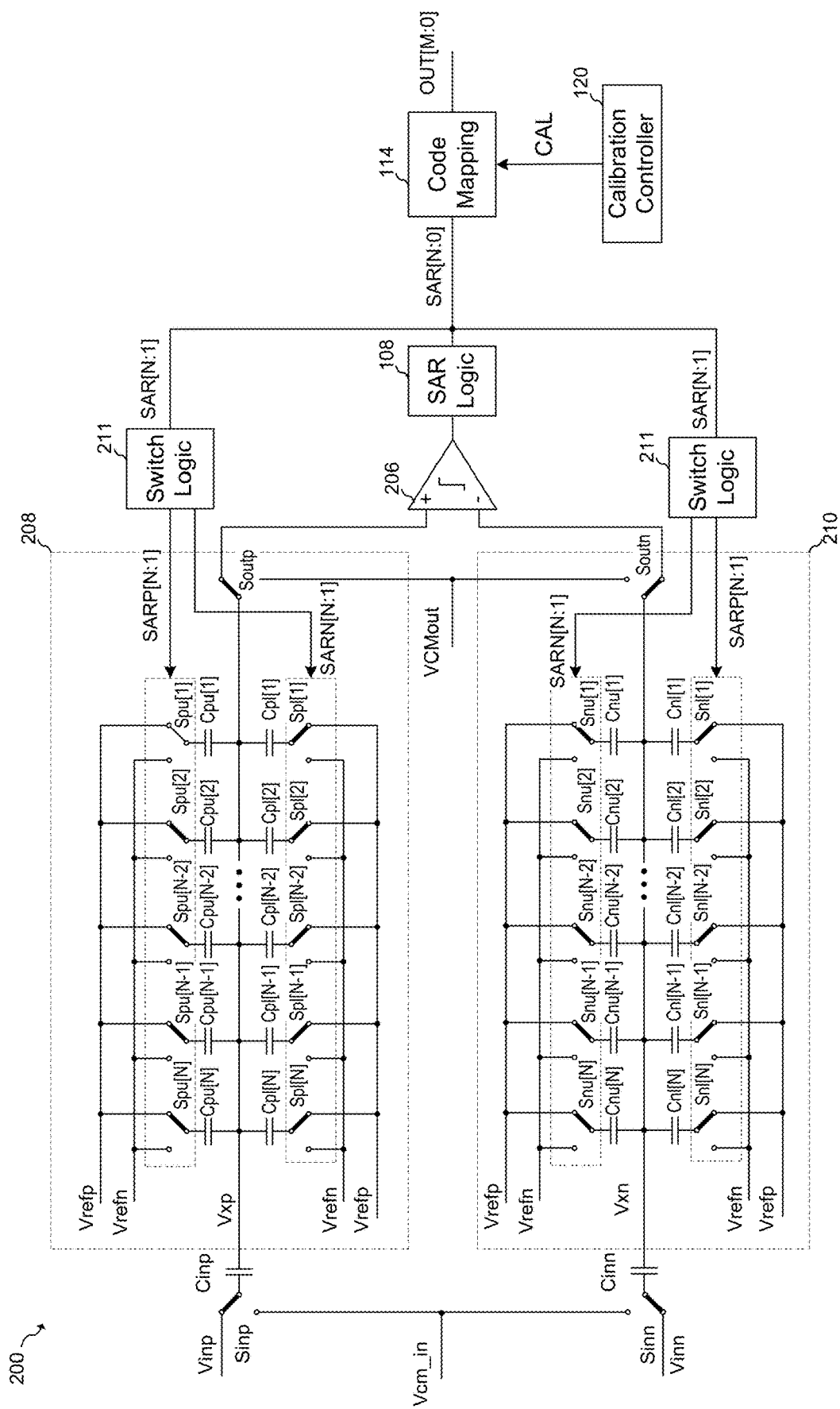
FIG. 2A illustrates a schematic of an embodiment SAR ADC that includes two capacitor arrays.

FIG. 2A illustrates a schematic of an embodiment successive approximation ADC 200 that is implemented differentially using charge redistribution DACs 208 and 210. As shown, ADC 200 includes a positive branch charge redistribution DAC 208 and a negative branch charge redistribution DAC 210 that are configured to sample and hold a differential input voltage Vinp−Vinn, perform a differential digital-to-analog conversion, and subtract the digital-to-analog converted value from the sampled and held differential input voltage. In some embodiments, the combination of positive branch charge redistribution DAC 208 and negative branch charge redistribution DAC 210 effectively perform the functions of sample and hold circuit 102, DAC 112 and summing circuit 104 shown and described above with respect to FIG. 1. Comparator 206 is coupled to the outputs of positive branch charge redistribution DAC 208 and negative branch charge redistribution DAC 210; SAR 108 is coupled to the output of comparator 206; and code mapping circuit 114 is coupled to the output of SAR 108. Switch logic 211 maps output SAR[N:1] of SAR logic 108 to the requisite switching signals needed for DACs 208 and 210.

As shown, each of positive branch charge redistribution DAC 208 and negative branch charge redistribution DAC 210 comprises two weighed arrays of capacitors. Positive branch charge redistribution DAC 208 includes an upper array of N capacitors Cpu[N] to Cpu[1] and corresponding switches Spu[N] to Spu[1], and a lower array of N capacitors Cpl[N] to Cpl[1] and corresponding switches Spl[N] to Spl[1]. Similarly, negative branch charge redistribution DAC 210 includes an upper array of N capacitors Cnu[N] to Cnu[1] and corresponding switches Snu[N] to Snu[1], and a lower array of N capacitors Cnl[N] to Cnl[1] and corresponding switches Snl[N] to Snl[1]. In an embodiment, the top plate of each capacitor in the upper and lower arrays of positive branch redistribution DAC 208 shares a common node Vxp; and the top plate of each capacitor in the upper and lower arrays of negative branch redistribution DAC 210 shares a common node Vxn. Positive branch charge redistribution DAC 208 includes input capacitor Cinp having a bottom plate selectively coupled between positive input voltage node Vinp or input common mode voltage node VCMin via switch Sinp, and includes output switch Soutp that is configured to couple the top plates of its capacitor array to output common mode voltage node VCMout. In a similar manner, negative branch charge redistribution DAC 210 includes input capacitor Cinn having a bottom plate selectively coupled between negative input voltage node Vinn or input common mode voltage node VCMin via switch Sinn, and includes output switch Soutn that is configured to couple the top plates of its capacitor array to output common mode voltage node VCMout.

During operation, positive branch charge redistribution DAC 208 samples positive input voltage Vinp on bottom plate of input capacitor Cinp by connecting the bottom plate of input capacitor Cinp to input voltage node Vinp via switch Sinp, and by coupling the top plate of capacitor Cinp (along with the top plate of array capacitors Cpu[N] to Cpu[1] and array capacitors Cpl[N] to Cpl[1]) to voltage node VCMout via switch Soutp. As such, voltage Vinp−VCMout is applied to input capacitor Cinp. During this sampling phase the bottom plates of array capacitors Cpu[N] to Cpu[1] are coupled to positive reference voltage Vrefp, and the bottom plates of array capacitors Cpl[N] to Cpl[1] are coupled to negative reference voltage Vrefn. Similarly, negative branch charge redistribution DAC 210 samples negative input voltage Vinn on the bottom plate of input capacitor Cinn by connecting the bottom plate of input capacitor Cinn to input voltage node Vinn via switch Sinn, and by coupling the top plate of capacitor Cinn (along with the top plate of array capacitors Cnu[N] to Cnu[1] and array capacitors Cnl[N] to Cnl[1]) to voltage node VCMout via switch Soutn. As such, voltage Vinn–VCMout is applied to input capacitor Cinp. During the sampling phase the bottom plates of array capacitors Cnu[N] to Cnu[1] are coupled to negative reference voltage Vrefn, and the bottom plates of array capacitors Cnl[N] to Cnl[1] are coupled to positive reference voltage Vrefp.

After the differential input voltage Vinp–Vinn has been sampled, a redistribution phase of the first successive approximation cycle is performed. In one embodiment, at the beginning of this phase, all the DAC capacitors maintain the state that they had during the sampling phase, which is the following: the bottom plates of array capacitors Cpu[N] to Cpu[i] are coupled to positive reference voltage Vrefp, the bottom plates of array capacitors Cpl[N] to Cpl[1] are coupled to negative reference voltage Vrefn, the bottom plates of array capacitors Cnu[N] to Cnu[1] are coupled to negative reference voltage Vrefn, and the bottom plates of array capacitors Cnl[N] to Cnl[1] are coupled to positive reference voltage Vrefp.

At the end of the redistribution phase of the first successive approximation cycle the value of the Vxp–Vxn voltage is proportional to the value of the sampled differential input Vinp-Vinn. The comparator 206 determines whether top plate voltage Vxp of positive branch charge redistribution DAC 208 exceeds the top plate voltage Vxn of negative branch charge redistribution DAC 210.

If comparator 206 determines that voltage Vxp exceeds voltage Vxn, the most significant bit SARP<N> of SARP<N:1> is set low and the most significant bit SARN<N:1> is set high. This causes the bottom plate of capacitor Cpu[N] to be coupled to negative reference voltage Vrefn and the bottom plate of capacitor Cnl[N] to be coupled to positive reference voltage Vrefp. In some embodiments, the bottom plates capacitors Cpl[N] and Cnu [N] maintain the same state as they were during the sampling phase. On the other hand, if comparator 206 determines that voltage Vxp does not exceed voltage Vxn, the most significant bit SARP<N> is set high and SARN<N> is set low. This causes the bottom plate of capacitor Cpl[N] to be coupled to positive reference voltage Vrefp, and causes the bottom plate of capacitor Cnu[N] to be coupled to negative reference voltage Vrefn. In some embodiments, the bottom plates of the capacitors Cpu[N] and Cnl[N] maintain the same state as they were during the sampling phase. In any case, the comparator decision is translated into a change of the state of a portion of the capacitors, which results in a variation of the Vxp-Vxn voltage. The comparator 206 makes a decision based on this new voltage value. According to this decision, the SAR LOGIC block sets the SARP<N-1> and SARN<N-1> bits. Similar to the previous state, a variation of the SARP<N-1> and SARN<N-1> bit causes a change in the state of the caps Cpu[N-1], Cpl[N-1], Cnu[N-1], and Cnl[N-1] that is translated into a new adjustment of the Vxp-Vxn voltage. This cycle is repeated until all the SAR bits are defined.

In some embodiments, the bottom plates of capacitors Cpu[N] to Cpu[1] are selectively coupled to positive reference voltage Vrefp or negative reference voltage Vrefn via switches Spu[N] to Spu[1]; the bottom plates of capacitors Cpl[N] Cpl[1] are selectively coupled to positive reference voltage Vrefp or negative reference voltage Vrefn via switches Spl[N] to Spl[1]; the bottom plates of capacitors Cnu[N] Cnu[1] are selectively coupled to positive reference voltage Vrefp or negative reference voltage Vrefn via switches Snu[N] to Snu[1]; and the bottom plates of capacitors Cnl[N] Cnl[1] are selectively coupled to positive reference voltage Vrefp or negative reference voltage Vrefn via switches Snl[N] to Snl[1].

During operation, for undecided bits i that have a lower or equal bit value than particular bit (e.g., the MSB-a$^{th}$ bit) associated with the present successive approximation cycle, SARP<i>=SARN<i>=0. For bits j having higher bit values associated with previously performed successive approximation cycles, for a high bit value SARP<j>=1 and SARN<j>=0, while for a low bit value SARP<j>=0 and SARN<j>=1.

It should be understood that ADC 200 shown in FIG. 2A is just one of many possible differential capacitor array based SAR ADC configurations that may be used to implement embodiment ADCs. In alternative embodiments, other differential array based SAR ADC configurations could also be used. For example, in alternative embodiments, input capacitors Cinp and Cinn and switches Sinp and Sinn may be omitted. In such embodiments, positive input voltage Vinp is applied to the bottom plates of the capacitors of DAC 208 and negative input voltage Vinn is applied to the bottom plates of the capacitors of DAC 210 during the sampling phase.

In various embodiments, successive approximation logic 108 is implemented using successive approximation circuits and systems known in the art. In one embodiment, SAR 108 is implemented using a shift register with associated control logic, a state machine, or other digital logic implementations known in the art. In some embodiments, SAR 108 may be implemented using a programmable processor.

Comparator 206 may be implemented using comparator circuits and systems known in the art. For example, comparator 206 may be implemented using an amplifier, a clocked comparator, a Schmitt trigger, or other circuit suitable for comparing two voltages.

In various embodiments, array capacitors Cpu[N] to Cpu [1], Cpl[N] to Cpl[1], Cnu[N] to Cnu[1], and Cnl[N] to Cnl[1], are weighted in a sub-binary manner. FIG. 2B illustrates one manner in which these capacitors could be weighted. For example, capacitors Cpu[12], Cpl[12], Cnu [12] and Cnl[12] may each have a weight of 111 unit capacitors corresponding to a normalized weight of 1776; Cpu[11], Cpl[11], Cnu[11] and Cnl[11] may each have a weight of 64 unit capacitors corresponding to a normalized weight of 1024; Cpu[10], Cpl[10], Cnu[10] and Cnl[10] may each have a weight of 36 unit capacitors corresponding to a normalized weight of 576; Cpu[9], Cpl[9], Cnu[9] and Cnl[9] may each have a weight of 20 unit capacitors corresponding to a normalized weight of 320; Cpu[8], Cpl[8], Cnu[8] and Cnl[8] may each have a weight of 11 unit capacitors corresponding to a normalized weight of 176; Cpu[7], Cpl[7], Cnu[7] and Cnl[7] may each have a weight of 6 unit capacitors corresponding to a normalized weight of 96; Cpu[6], Cpl[6], Cnu[6] and Cnl[6] may each have a weight of 4 unit capacitors corresponding to a normalized weight of 64; Cpu[5], Cpl[5], Cnu[5] and Cnl[5] may each have a weight of 2 unit capacitors corresponding to a normalized weight of 32; Cpu[4], Cpl[4], Cnu[4] and Cnl[4] may each have a weight of 1 unit capacitor corresponding to a normalized weight of 16; Cpu[3], Cpl[3], Cnu[3] and Cnl[3] may each have a weight of ½ of a unit capacitor corresponding to a normalized weight of 8; Cpu[2], Cpl[2], Cnu[2] and Cnl[2] may each have a weight of ¼ of a unit capacitor corresponding to a normalized weight of 4; and Cpu[1], Cpl[1], Cnu[1] and Cnl[1] may each have a weight of ⅛ of a unit capacitor corresponding to a normalized weight of 2. In some embodiments, the last redundant bit 0 is not associated with any physical capacitor in the DAC. Rather the last redundant bit is given by a decision made by comparator 206 in response to the last successive approximation cycle.

In various embodiments, array capacitors Cpu[N] to Cpu[1], Cpl[N] to Cpl[1], Cnu[N] to Cnu[1], and Cnl[N] to Cnl[1] may be implemented using the same number, or a multiple of the number of unit capacitors designated for each capacitor according to the table in FIG. 2B. In some embodiments, the sub-unit capacitors associated with one or more of redundant bits 1 to 3 may be implemented using capacitors that are physically smaller than the unit capacitor. In an embodiment, the capacitance associated with each unit capacitor may be between about 90 aF and about 80 fF; however, values outside of this range may also be used depending on the particular embodiment and its specifications. In one embodiment, input capacitors Cinp and Cinn have value of about 270 fF. Alternatively, other capacitances may be used.

In alternative embodiments, each capacitor array may be configured to be binary weighted, as shown in the table illustrated in FIG. 2C.

FIGS. 2D and 2E illustrate two tables that show the operation of SAR 108. In particular, FIG. 2D is associated with the value of SARP<12:0>, where SARP<12:0>=SAR<12:0>, and FIG. 2E is associated with the value of SARN<12:0>. However, in some embodiments, such as the embodiment of FIG. 2A, only SARP<12:1> and SARN<12:1> are routed to DACs 208 and 210, respectively. Each row in each table is associated with a particular successive approximation cycle. The designation C[1] represents the output of comparator 306 that is associated with the ith bit of the SAR output SARP<12:0>, and the designation !C[i] represents the inverse of the output of comparator 206 that is associated with the ith bit of the SAR output SARN<12:0>.

With reference to FIG. 2D, the first row of the table represents the first successive approximation cycle. As shown, SARP<12> is held low along with remaining undecided bits SARP<11:0>. In the second cycle, SARP<12> is assigned the value C[12], which represents the comparator result for bit 12 in the first cycle, SARP<11> is assigned a low value, while the remaining undecided bits SARP<10:0> are also held low. In the second cycle, SARP<12> is assigned the value C[12], which represents the comparator result for bit 12 in the first cycle, SARP<11> is assigned the value C[ii], which represents the comparator result for bit 11 in the second cycle, SARP<10> is assigned a low value, while the remaining undecided bits SARP<9:0> are also held low. SAR 108 continues in a similar manner for the remaining successive approximation cycles until the final comparison result C[0] has been received.

With reference to FIG. 2E, the first row of the table represents the first successive approximation cycle. As shown, SARN<12> is held low along with remaining undecided bits SARN<11:0>. In the second cycle, SARN<12> is assigned the value !C[12], which represents the inverse of the comparator result for bit 12 in the first cycle, SARN<11> is assigned a low value, while the remaining undecided bits SARN<10:0> are also held low. In the second cycle, SARN<12> is assigned the value !C[12], which represents the inverse of the comparator result for bit 12 in the first cycle, SARN<11> is assigned the value !C[ii], which represents the inverse of the comparator result for bit 11 in the second cycle, and SARN<10> is assigned a low value, while the remaining undecided bits SARN<9:0> are also held low. SAR 108 continues in a similar manner for the remaining successive approximation cycles until the final inverse comparison result !C[0] has been received.

Figure 2F:
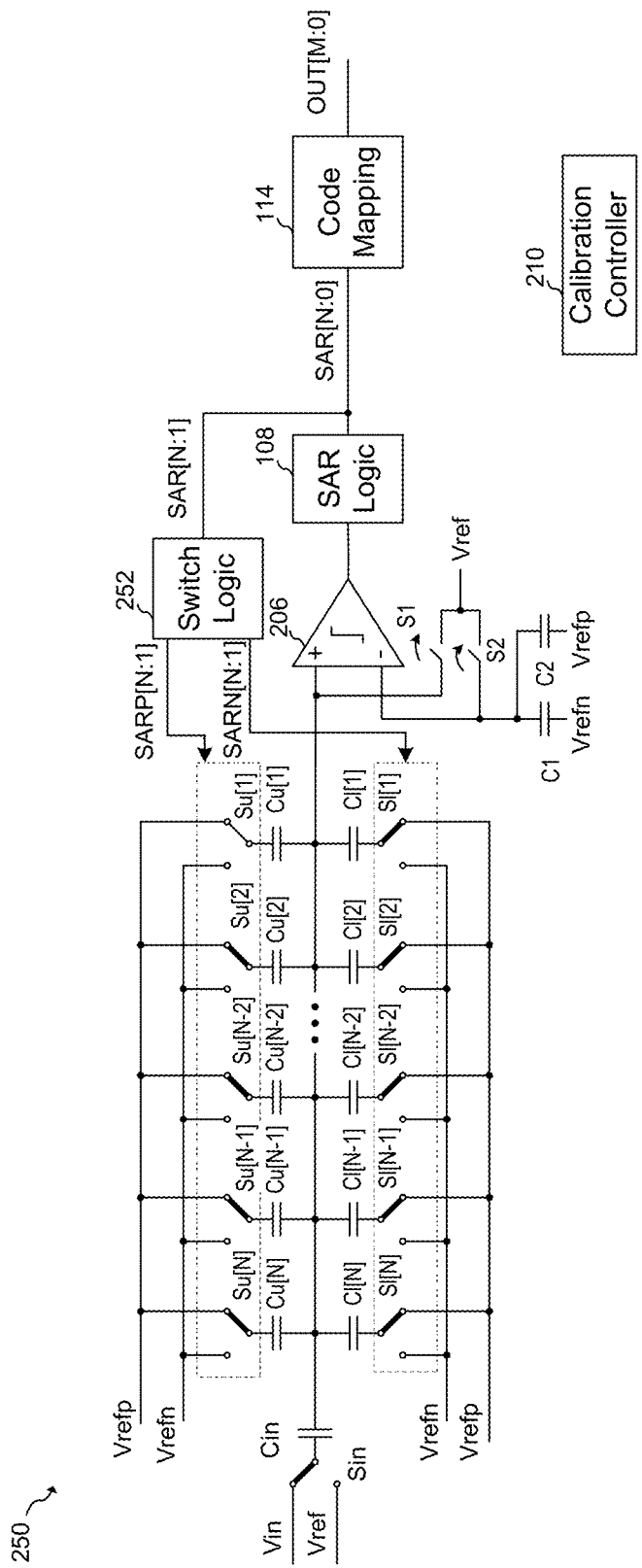
FIG. 2F illustrates an embodiment SAR ADC that includes a single capacitor array.

In some embodiments, a single-ended ADC may be implemented using a single capacitor array as shown in FIG. 2F, which illustrates single-ended SAR ADC 250. The structure of SAR ADC 250 is similar to the structure of differential SAR ADC 200 shown in FIG. 2A, with the exception that a single capacitor array is used instead of two capacitor arrays. As shown, the capacitor array includes capacitors Cu[N] to Cu[1] and Cl[N] to Cl[i] coupled to respective switches Su[N] to Su[1] and Sl[N] to Sl[1]. In some embodiments these capacitors may be switched during operation (e.g., during normal successive approximation conversions and calibration) in a similar manner as Cpu[N] to Cpu[1] and Cpl[N] to Cpl[1] described above with respect to FIG. 2A. Capacitors Cu[N] to Cu[1] and Cl[N] to Cl[1] may have binary weights or sub-binary weights.

In an embodiment, the top plates of capacitors Cu[N] to Cu[1] and Cl[N] to Cl[1] are coupled to the positive input of comparator 206. During operation, input voltage Vin is coupled to the bottom plate of input capacitor Cin via switch Sin, while the top plates of capacitors Cu[N] to Cu[1] and Cl[N] to Cl[1] and reference capacitors C1 and C2 are coupled to reference voltage Vref via switches S1 and S2. During conversion (e.g. when the voltage of the top plates of capacitors Cu[N] to Cu[1] and Cl[N] to Cl[1] are being evaluated), reference voltage Vref is coupled to the bottom plate of input capacitor Cin, while the top plates of capacitors Cu[N] to Cu[1] and Cl[N] to Cl[1] are allowed to float by opening switches S1 and S2. It should be understood that SAR ADC 250 shown in FIG. 2F is just one of many possible single-ended capacitor array based SAR ADC configurations that may be used to implement embodiment ADCs. In alternative embodiments other single-ended capacitor array based SAR ADC configurations could also be used. For example, in an alternative embodiment, input capacitor Cin may be omitted. In such an embodiment, the bottom plates of capacitors Cu[N:1] and Cl[N:1] are directly connected to switch Sin such that input voltage Vin is sampled on the bottom plates of the capacitors Cu[N:1] and Cl[N:1] In a further alternative embodiment, input capacitors Cinp and Cinn used in the differential embodiment of FIG. 2A could also be omitted such that node Vxp is directly connected to switch Sinp and node Vxn is directly connected to switch Sinn.

In embodiments of the present invention, errors in the weight of capacitors (also referred to as a "capacitance weight") corresponding to a particular bit are corrected by measuring the weight of the capacitors dedicated to the particular bit, and then digitally adjusting the weight of the particular bit via code mapping circuit 114 shown in FIG. 2A. For, example, with respect to bit weighting charge shown in FIG. 2B, if bit 10 were to have an actual weight of 577 instead of its nominal weight of 576, code mapping circuit 114 could be calibrated to apply the actual weight of 577 instead of 576 to the output of SAR 108.

Generally, in order to determine the actual weight of a set of capacitors associated with a particular bit, the bottom plates of these capacitors are set to predetermined voltages during a sampling phase. Next, the associated weight of these capacitors are determined during a redistribution phase during which the SAR ADC itself measures the weights of its own capacitors. However, in embodiments of the present invention, the bottom plates of capacitors associated with bit values larger than the bit value being tested, as well as the bottom plates of capacitors associated with bit values smaller than the bit valued being tested are coupled to various reference voltages in a manner that equalizes the total capacitance coupled to a first reference voltage to the total capacitance coupled to a second reference voltage during the sampling phase. By equalizing this capacitance, transients across capacitors terminals of the capacitor array that occur between the sampling phase and the redistribution phase can be reduced or eliminated, which advantageously leads to a more accurate weight measurement. In various embodiments, the capacitance coupled to the first reference voltage may be equal to the capacitance coupled to the second reference voltage during the sampling phase. Alternatively, the capacitance coupled to the first reference voltage may not be equal to the capacitance coupled to the second reference voltage during the sampling phase, but is equalized to a greater extent that it would be if embodiment equalization techniques were not applied and/or is equalized to the extent that weight measurement errors are within a predetermined range of error.

Figure 3A:
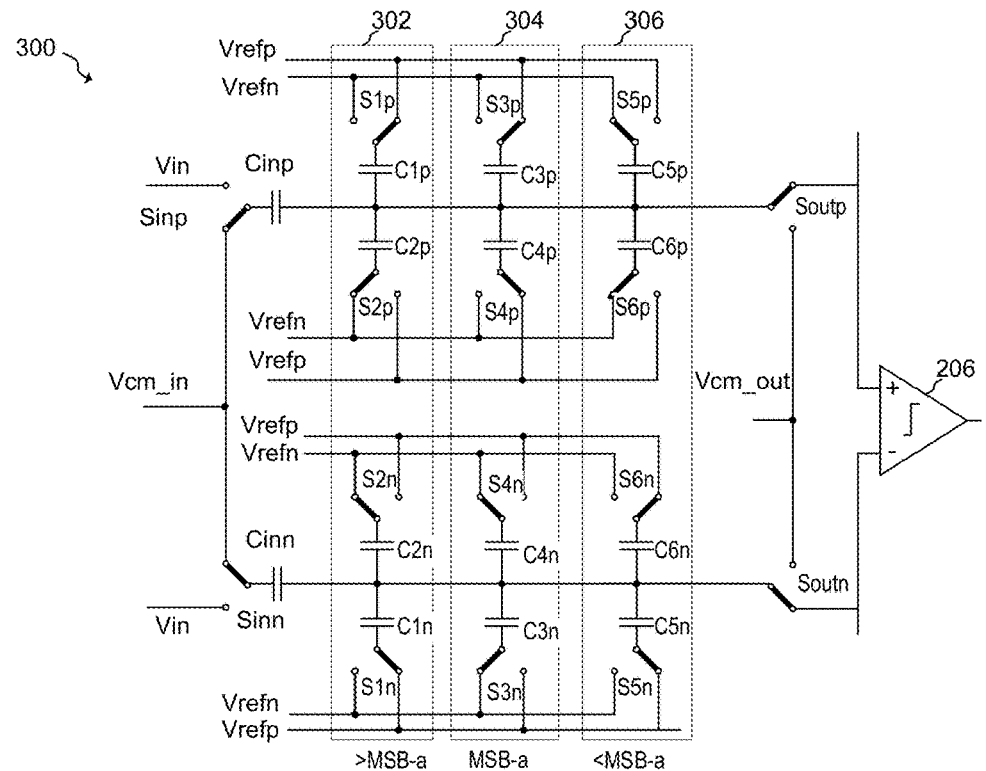
FIGS. 3A, 3B and 3C illustrate capacitor array configurations according to an embodiment.
Figure 3B:
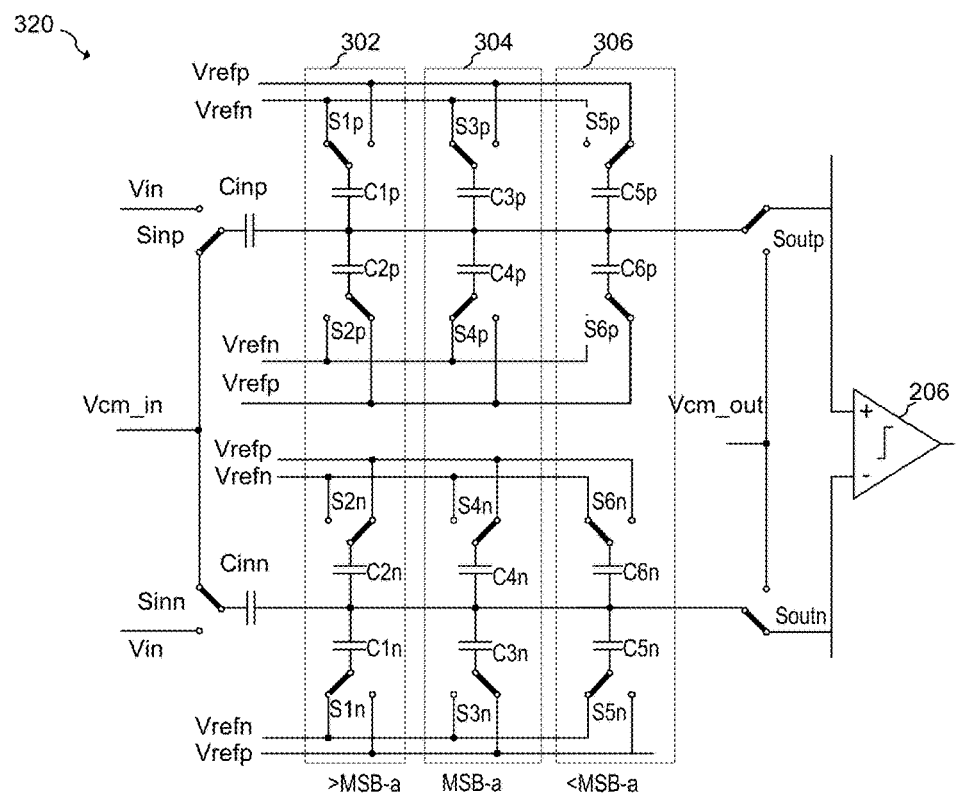

FIGS. 3A and 3B illustrate capacitor array sampling phase configurations for an embodiment calibration of a split DAC architecture. FIG. 3A illustrates a simplified schematic 300 representing a portion of SAR ADC in a first sampling configuration. In particular, capacitor array subset 304 represents array capacitors and switches that correspond to the particular bit being measured for the purpose of calibration. The nomenclature used to refer to bit being tested is "MSB-a," where a is an integer from 0 to n−2, where n is the number of bits associated with the capacitor array. Capacitor array subset 302 represents array capacitors and switches that correspond to bits more significant than the particular bit being measured (e.g., >MSB-a), and capacitor array subset 306 represents array capacitors and switches that correspond to bits less significant than the particular bit being measured (e.g., <MSB-a). The number of capacitors and switches in each set varies according to the bit being tested. For example, for the capacitor array represented by FIG. 2B, if redundant bit 9 were being evaluated (e.g., the MSB-a$^{th}$ bit), capacitor array subset 302 would correspond to the capacitors associated with bits 10, 11 and 12; capacitor array subset 304 would correspond to the capacitors associated with bit 9; and capacitor array subset 306 would correspond to the capacitors associated with bits 8 and lower.

As shown with respect to the capacitor array subset 302 corresponding to bits that are more significant than the bit being tested (e.g., >MSB-a), the bottom plate of capacitors C1p and C1n are coupled to reference voltage Vrefp via respective switches, S1p and S1n, while the bottom plates of capacitors C2p and C2n are coupled to reference voltage Vrefn via respective switches S2p and S2n. In capacitor array subset 304 corresponding to the bit being tested (e.g. MSB-a), the bottom plates of capacitors C3p and C4p are coupled to reference voltage Vrefp via respective switches, S3p and S4p, while the bottom plates of capacitors C3n and C4n are coupled to reference voltage Vrefn via switches S3n and S4n. Lastly, in capacitor array subset 306 corresponding to the bits less significant than the bit being tested (e.g., <MSB-a), the bottom plates of capacitors C5p and C6p are coupled to reference voltage Vrefn via respective switches, S5p and S6p, while the bottom plates of capacitors C5n and C6n are coupled to reference voltage Vrefp via switches S5n and S6n.

As mentioned above, once sampling phase is complete, a successive approximation operation is performed in order to determine the weight of the capacitors associated with the MSB-a$^{th}$ bit. In some cases, however, the determined value may be subject to small offsets associated with the circuitry of the SAR ADC. For example, a small offset of comparator 206 may add an offset to the measured value of the weight being calibrated. In some embodiments, the effect of this offset is addressed by measuring a particular capacitor weight two different ways. In such embodiments, a weight is measured using the configuration of FIG. 3A (which will be referred to as a "Type 1" measurement, and is measured using the configuration of FIG. 3B in which the reference voltages assigned to the bottom plates of the capacitors array is swapped, which will be referred to as a "Type 2" measurement. When then two types of measurements are averaged together, measurement offsets may be at least partially canceled out. In such embodiments, the polarity of the comparator decisions for "Type 1" and "Type 2" measurements are opposite from each other in order achieve this cancellation. In addition, the calculated average may be shifted, for example, by 0.5 LSB in order to account for transfer function thresholds. In some embodiments, multiple "Type 1" and "Type 2" measurements are made and averaged in order to derive an averaged weight value. The order of these measurements may be made in a predetermined sequence, a random sequence, or a pseudo random sequence.

FIG. 3B illustrates a simplified schematic 320 representing a portion of SAR ADC in a second or "Type 2" sampling configuration. Schematic 320 of FIG. 3B is similar to Schematic 300 of FIG. 3B with the exception that the bottom plate capacitor connections of the capacitor array are swapped. For example, the bottom plates of the capacitors coupled to reference voltage Vrefp in FIG. 3A are connected to reference voltage Vrefn in FIG. 3B. Similarly, the bottom plates of the capacitors coupled to reference voltage Vrefn in FIG. 3A are connected to reference voltage Vrefp in FIG. 3B. More specifically, with respect to the capacitor array subset 302 corresponding to bits that are more significant than the bit being tested (e.g., >MSB-a), the bottom plate of capacitors C1p and C1n are coupled to reference voltage Vrefn via respective switches, S1p and S1n, while the bottom plates of capacitors C2p and C2n are coupled to reference voltage Vrefp via respective switches S2p and S2n. In capacitor array subset 304 corresponding to the bit being tested (e.g., MSB-a), the bottom plates of capacitors C3p and C4p are coupled to reference voltage Vrefn via respective switches, S3p and S4p, while the bottom plates of capacitors C3n and C4n are coupled to reference voltage Vrefp via switches S3n and S4n. Lastly, in capacitor array subset 306 corresponding to the bits less significant than the bit being tested (e.g., <MSB-a), the bottom plates of capacitors C5p and C6p are coupled to reference voltage Vrefp via respective switches, S5p and S6p, while the bottom plates of capacitors C5n and C6n are coupled to reference voltage Vrefn via switches S5n and S6n.

Figure 3C:
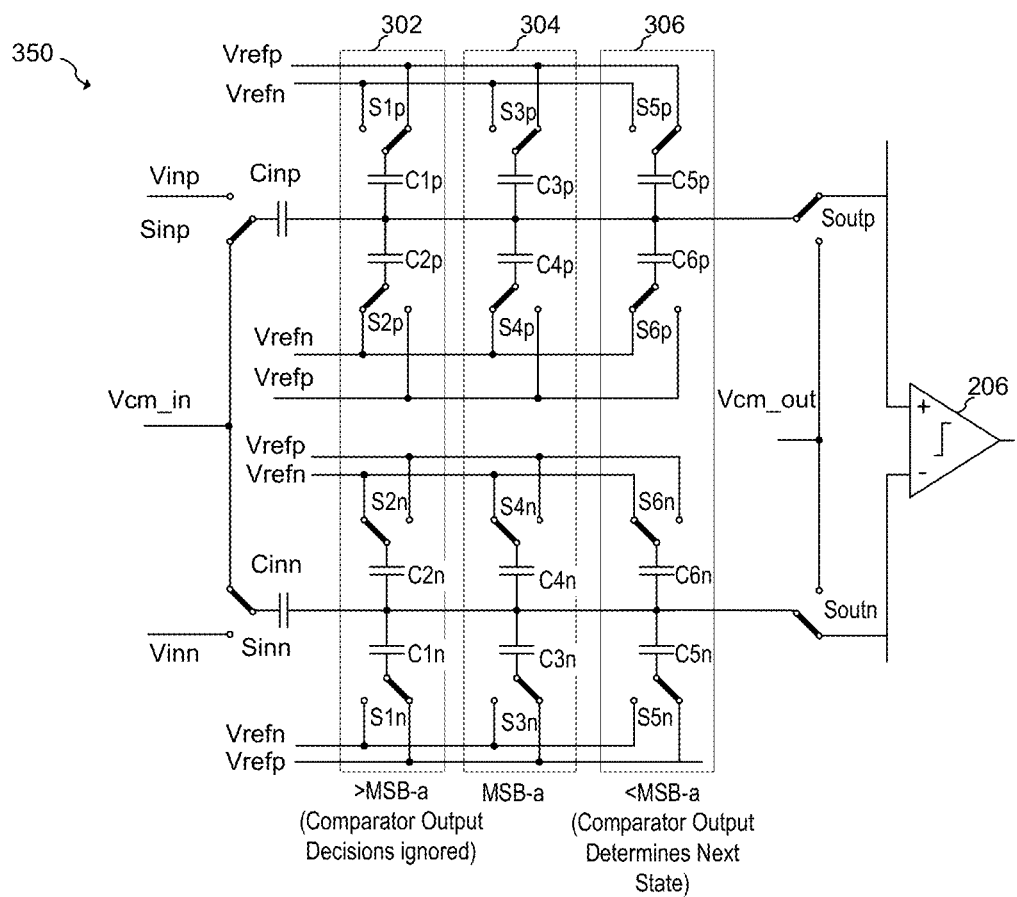

FIG. 3C illustrates a simplified schematic 330 representing a portion of SAR ADC at the beginning of the redistribution phase in which the MSB-a$^{th}$ bit of the SAR ADC is measured after sampling using the Type 1 sampling configuration discussed above with respect to FIG. 3A. As shown, the bottom plates of the capacitors in capacitor array subset 302 representing the array capacitors and switches that correspond to bits more significant than the particular bit being measured (e.g., >MSB-a) maintain their same coupling connections as the sampling phase shown in FIG. 3A. In fact, these connections remain "frozen" for the entire duration of the successive approximation phase of the weight measurement. The initial settings for capacitor array subset 304 representing the array capacitors and switches that correspond to the particular bit being measured (e.g., MSB-a), and capacitor array subset 306 represents array capacitors and switches that correspond to bits less significant than the particular bit being measured (e.g., <MSB-a) have a different coupling configuration.

As shown, in capacitor array subset 304 corresponding to the bit being tested (e.g., MSB-a), the bottom plates of capacitors $C3p$ and $C3n$ are coupled to reference voltage Vrefp via respective switches, $S3p$ and $S3n$, while the bottom plates of capacitors $C4p$ and $C4n$ are coupled to reference voltage Vrefn via switches $S4p$ and $S4n$. Lastly, in capacitor array subset 306 corresponding to the bits less significant than the bit being tested (e.g., <MSB-a), the bottom plates of capacitors $C5p$ and $C5n$ are coupled to reference voltage Vrefp via respective switches, $S5p$ and $S5n$, while the bottom plates of capacitors $C6p$ and $C6n$ are coupled to reference voltage Vrefn via switches $S6p$ and $S6n$.

During redistribution, the switch positions for capacitor array subset 302 corresponding to bits more significant than the bit being tested (e.g., >MSB-a) are frozen and the comparator decisions are ignored. In some embodiments, the comparison cycles for these bits could be skipped. In such embodiments, the redistribution phase begins with capacitor array subset 304 corresponding to the bit being tested. For example, when the output of the comparator is high, switches $S4p$ and $S3n$ change their positions, such that the bottom plate of capacitor $C4p$ gets reconnected from reference voltage Vrefn to reference voltage Vrefp, and the bottom plate of capacitor $C3n$ gets reconnected from reference voltage Vrefp to reference voltage Vrefn. However, switches $S3p$ and $S4n$ maintain their positions such that the bottom plate of capacitor $C3p$ remains connected to reference voltage Vrefp and the bottom plate of capacitor $C4n$ remains connected to reference voltage Vrefn. On the other hand, when the output of the comparator is low, switches $S3p$ and $S4n$ change their connection such that the bottom plate of capacitor $C3p$ gets reconnected from reference voltage Vrefp to reference voltage Vrefn and the bottom plate of capacitor $C4n$ gets reconnected from reference voltage Vrefn to reference voltage Vrefp. Switches $S4p$ and $S3n$ maintain their positions such that the bottom plate of capacitor $C4p$ remains connected to reference voltage Vrefn and the bottom plate of capacitor $C3n$ remains connected to reference voltage Vrefp. Redistribution proceeds in a similar manner for the capacitor array subset 306 representing the lower significant bits (e.g., <MSB-a) on a bit by bit basis until the conversion is complete. Even though the switch configurations for the Type 1 and Type 2 sampling phases are different from each other, the redistribution phase following a Type 2 sampling operation uses the same configuration as the redistribution phase following a Type 1 sampling operation in various embodiments. However, output code OUT<M:0> is calculated by code mapping block as if the polarity of the comparator decisions during a redistribution phase following a Type 2 sampling operation is inverted with respect to the redistribution phase following a Type 1 sampling operation. However, the comparator decisions are fed back to the capacitor array using the same polarity during the redistribution phase following a Type 2 sampling operation as the redistribution phase following a Type 1 sampling operation.

FIGS. 4A to 4C include tables that show how embodiment systems and methods can be used to balance the amount of capacitance coupled to each respective reference voltage node during sampling phases of a calibration process.

The table of FIG. 4A represents an exemplary sampling configuration. As shown, the table of FIG. 4A details the number of unit capacitors having bottom plates coupled to Vrefp for the upper capacitor array of SAR ADC 200 shown in FIG. 2A during the sampling phase of various respective weight measurements according to the sub-binary weighting table shown in FIG. 2B. In particular, FIG. 2A illustrates an exemplary case in which capacitors corresponding to the MSBs greater than the bit being tested are coupled in the same manner as capacitors corresponding to the MSBs lower than the bit being tested. In this example, both the upper capacitor array and the lower capacitor array each have a total of 512 unit capacitors (or have a capacitance equivalent to 512 unit capacitors).

For example, when the $7^{th}$ bit is being tested (e.g., MSB-5), 12 unit capacitors of the upper array are coupled to reference voltage Vrefp, while the remaining 500 unit capacitors are coupled to reference voltage Vrefn. However, for the nominally ideal case (e.g., the case in which the number of unit capacitors respectively coupled to Vrefp is equal to the number of unit capacitors coupled to Vrefn), the number of capacitors coupled to Vrefp in the upper array is 256 capacitors as noted in the right-hand column of the table shown in FIG. 4A. Accordingly, there is an imbalance of 244 unit capacitors or −95.31% of the total capacitance of the upper capacitor array.

In another example, when the $8^{th}$ bit is being tested (e.g., MSB-4), 22 unit capacitors of the upper array are coupled to reference voltage Vrefp, while the remaining 490 unit capacitors are coupled to reference voltage Vrefn. Again, for the nominally ideal case the number of capacitors coupled to Vrefp in the upper array is 256 capacitors. Accordingly, there is an imbalance of 234 unit capacitors or −91.41% of the total capacitance of the upper capacitor array.

The table of FIG. 4B represents an embodiment sampling configuration. As shown, the table of FIG. 4B, details the number of unit capacitors having bottom plates coupled to Vrefp for the upper capacitor array of SAR ADC 200 shown in FIG. 2B during the sampling phase of various respective weight measurements when the embodiment sampling configuration shown in FIG. 3A is used instead of the exemplary sampling scheme discussed with respect to FIG. 4A. In this case, half of the capacitors associated MSBs greater than the bit being tested are also coupled to Vrefp, which facilitates a significantly lower capacitance imbalance.

For example, when the $7^{th}$ bit is being tested (e.g., MSB-5), a total of 254 unit capacitors of the upper array are coupled to reference voltage Vrefp, while the remaining 258 unit capacitors are coupled to reference voltage Vrefn. This is because in addition to the 12 unit capacitors corresponding to the $7^{th}$ bit, 11 unit capacitors corresponding to the $12^{th}$ bit, 64 unit capacitors corresponding to the $11^{th}$ bit, 36 unit capacitors corresponding to the $10^{th}$ bit, 20 unit capacitors corresponding to the $9^{th}$ bit, and 11 unit capacitors corresponding to the $8^{th}$ bit also have bottom plates coupled to Vrefp. Accordingly, there is an imbalance of only 2 unit capacitors or only −0.7% of the total capacitance of the upper capacitor array.

It can be seen, however, that for the $12^{th}$ bit (e.g., MSB-0), 222 unit capacitors are coupled to Vrefp in the upper capacitor array, which leads to an imbalance of −13.28% of the total capacitance of the capacitor array. While this particular configuration leads to improved performance, as will be detailed below, it is also possible to reduce the imbalance for the MSB by using an alternative embodiment sampling configuration as detailed in FIG. 4C, which is similar to the embodiment sampling configuration of FIG. 4B, with the exception of how bit 12 (e.g., MSB-0) is handled. As shown, the 20 unit capacitors associated with bit 9 are coupled to Vrefp and "frozen" during the redistribution phase associated with measuring the weight of the capacitors associated with bit 12. In other words, the capacitors associated with bit 9 (e.g., MSB-9) are not used to estimate the weight of the capacitors associated with bit 12. Here it can be seen that for the 12$^{th}$ bit, the 242 unit capacitors coupled to Vrefp in the upper capacitor array have an imbalance of 14 capacitors or −5.47% of the total capacitance of the upper capacitor array.

FIG. 4D illustrates an eye diagram of the differential voltage between the top plates of the upper and lower capacitor array of SAR ADC 200 as the ADC transitions from the sampling phase to the redistribution phase during a calibration weight measurement for the exemplary case corresponding to FIG. 4A (e.g., wherein there is a large capacitive imbalance to reference voltages Vrefp and Vrefn during the sampling phase). Traces 404 represent repeated Type 1 measurements, traces 402 represent repeated Type 2 measurements, and trace 406 represents the control voltage provided to sampling switches Soutp and Soutn. As is apparent in the eye diagram, there is a large transient in the differential voltage at the top plates of the upper and lower capacitor array when the array transitions from the sampling phase configuration to the redistribution configuration. This large transient occurs when charge within the capacitor array is redistributed from the unbalanced configuration of the sampling phase to the more balanced configuration of the redistribution phase. Additionally, some error is introduced at the end of the sampling phase due to the different impedance from the sampling switch to the CDAC which causes a difference in the charge injected on the CDAC caps. This difference may result in an offset on the sampled voltage that cannot be compensated by applying Type 1 and Type 2 measurements.

FIG. 4E illustrates an eye diagram of the differential voltage at the top plates of the upper and lower capacitor array of SAR ADC 200 as the ADC transitions from the sampling phase to the redistribution phase during a calibration weight measurement for the embodiment case corresponding to FIG. 4B (e.g., where the capacitive imbalance to reference voltages Vrefp and Vrefn is significantly reduced during the sampling phase). As is apparent in the eye diagram FIG. 4E, the large transient is not visible because the total capacitance coupled to respective reference voltages Vrefp and Vrefn in the upper and lower capacitors arrays during the sampling phase is very close to the total capacitance coupled to respective reference voltages Vrefp and Vrefn in the upper and lower capacitors arrays during the redistribution phase. Moreover, since the impedance between the sampling switch and CDAC is more balanced between the sampling phase and the redistribution phase, the resulting offset is smaller compared to the exemplary case of FIG. 4A and its corresponding eye diagram shown in FIG. 4D.

Figure 4F:
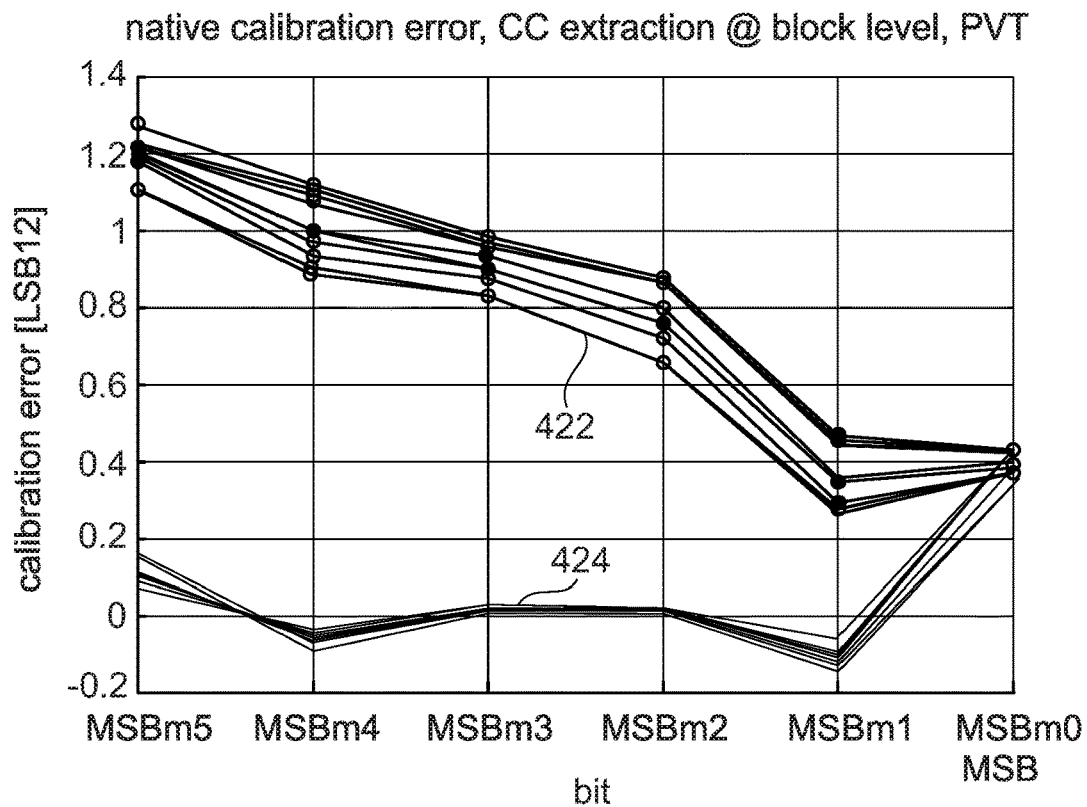

In various embodiments, improving the capacitive balance between reference nodes reduced calibration error. FIG. 4F shows a graph comparing the calibration error for a calibration measurement made according to the exemplary case corresponding to FIG. 4A (e.g., where there is a large capacitive imbalance to reference voltages Vrefp and Vrefn during the sampling phase) to the calibration error for the embodiment case corresponding to FIG. 4B (e.g., where the capacitive imbalance to reference voltages Vrefp and Vrefn is significantly reduced during the sampling phase). Traces 422 correspond to multiple calibration cases of the exemplary case of FIG. 4A. It can be seen that for the MSB-5, the calibration error is about 1.2 LSBs, and for MSB-0, the calibration error is about 0.4 LSBs. Traces 424 correspond to multiple calibration cases of the embodiment case of FIG. 4B. Here, it can be seen that for the for MSB-5, the calibration is about 0.1 LSBs, and for MSB-0, the calibration error is about 0.4 LSBs.

Figure 4G:
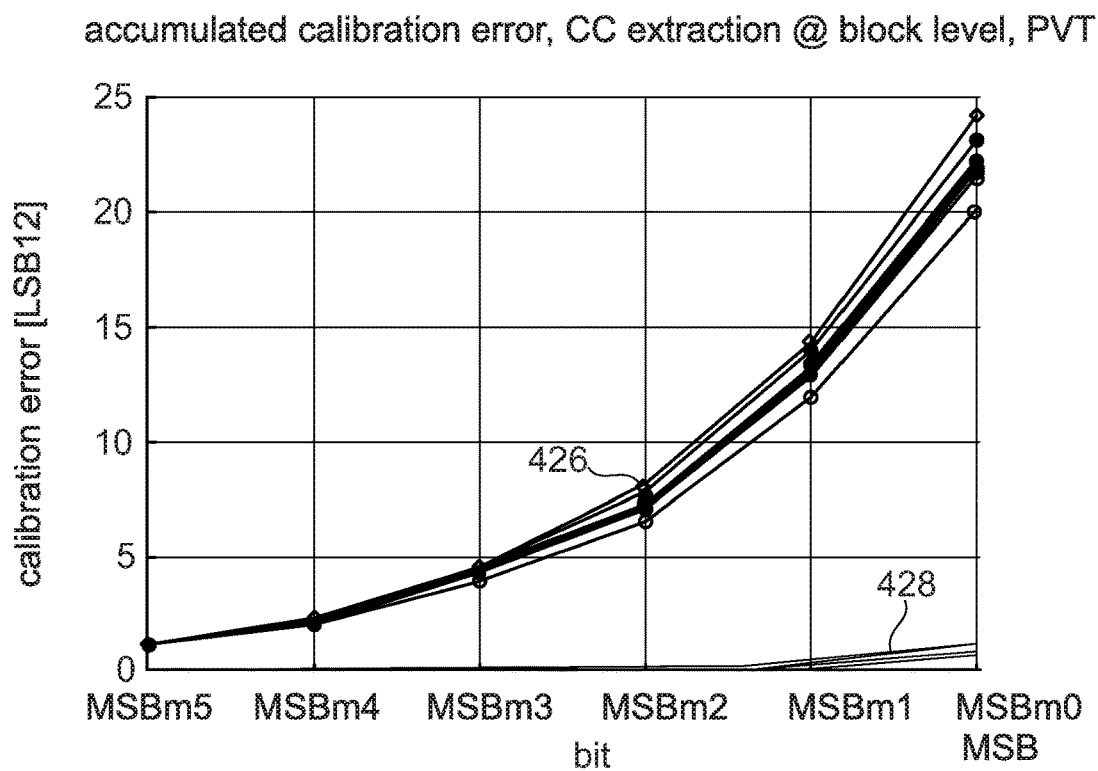

In the above example, the calibration error for the MSB (e.g., MSB-0) is about the same for both the exemplary case of FIG. 4A and the embodiment case of FIG. 4B since the identical capacitor configuration is used for the MSB in the sampling configuration. However, even though the calibration errors are the same for the MSB case the accumulated calibration error is significantly reduced as shown in the graph of FIG. 4G which illustrates a comparison of accumulated calibration error for the exemplary case of FIG. 4A and the embodiment case of FIG. 4B. In particular, traces 426 correspond to multiple calibration cases of the exemplary case of FIG. 4A, and traces 428 correspond to multiple calibration cases of the embodiment case of FIG. 4B. The total accumulated error at the MSB for the exemplary case of FIG. 4A is about 22 LSBs, while the total accumulated error at the MSB for the embodiment case of FIG. 4B is about 1 LSB, which is a significant improvement and facilitates acceptable performance in many situations. However, the calibration error of the MSB can also be improved as explained with respect to the embodiments of FIG. 4C described above and FIG. 5C described below. Regarding distortion performance, simulations of SAR ADC 200 shown in FIG. 2A show improvements in the spurious-free dynamic range (SFDR) of the embodiment case of FIG. 4B over the exemplary case of FIG. 4A. For example, for inputs of −6 dBFS, the embodiment case of FIG. 4B has an SFDR improvement of about 10 dB. For inputs of −40 dBFS, the embodiment case of FIG. 4B has an SFDR improvement of between about 17 dB and 20 dB.

Figure 4H:
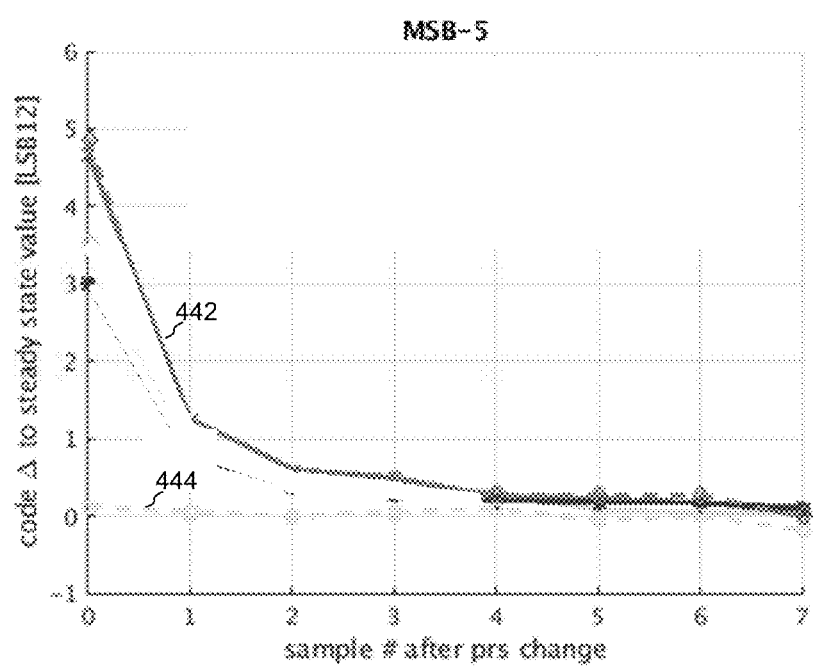

Improvements in calibration accuracy provided by embodiment calibration techniques become more pronounced when the effect of dielectric absorption in the capacitors of the capacitor array is considered. Dielectric absorption is an effect seen in certain types of capacitor dielectrics that causes a capacitor to be incompletely discharged when an attempt is made to quickly discharge the capacitor. Trace 442 of FIG. 4H represents the steady state calibration error in LSBs for MSB-5 over a set of sequential weight measurements after the measurement type transitions from Type 1 to Type 2 for the exemplary weight measurement scheme described above with respect to FIG. 4A. As can be seen by the Figure, the first measurement after the measurement type transition has calibration error of about 5 LSBs, followed by decreasing error as the number of subsequent samples increase. Trace 444, on the other hand, represents the same calibration error measurement taken using the exemplary weight measurement scheme described above with respect to FIG. 4B. It can be seen that the stead state code error stays below 0.1 LSB immediately after the measurement type transition and over subsequent measurement cycles.

It should be understood that the performance improvement described above with respect to FIGS. 4D to 4H represents just one set of examples that pertain to a particular embodiment ADC implementation. Other embodiment implementations may show different improvement metrics depending on the specific embodiment and its implementation. For example, using the embodiment weight measurement scheme described above with respect to FIG. 4C could be expected to yield increased performance improvement over the embodiment weight measurement scheme describe above with respect to FIG. 4B.

Figure 5A:
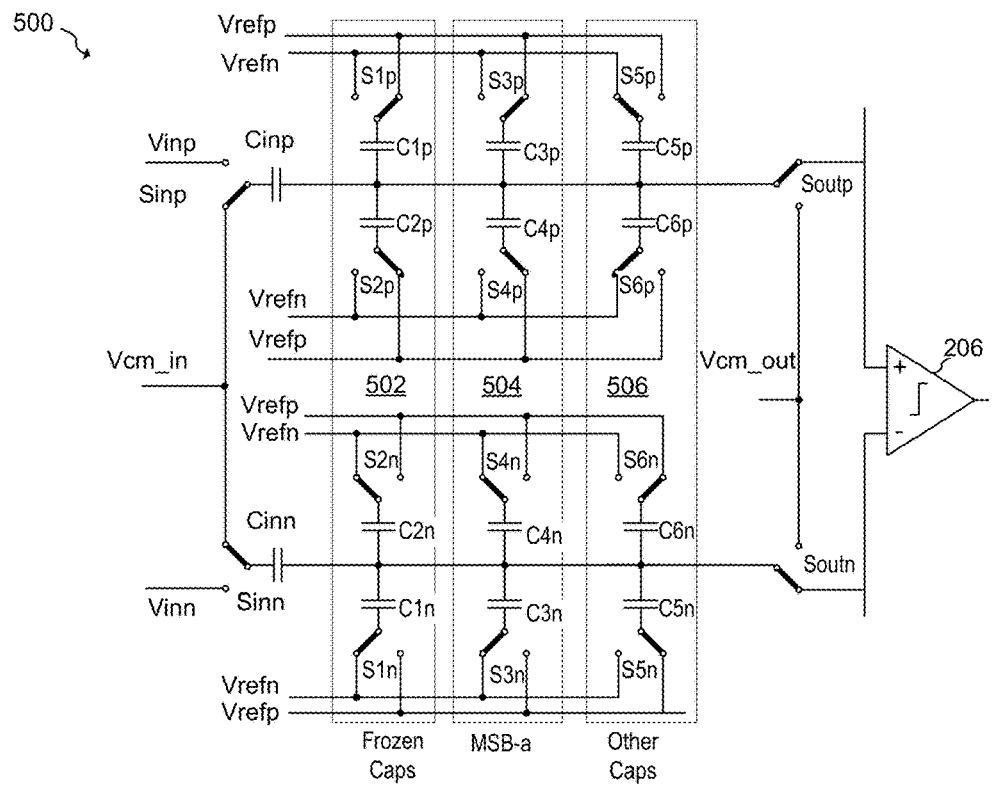
FIGS. 5A and 5B illustrate simplified schematics of a capacitor array showing switch configurations according to alternative embodiments.
Figure 5B:
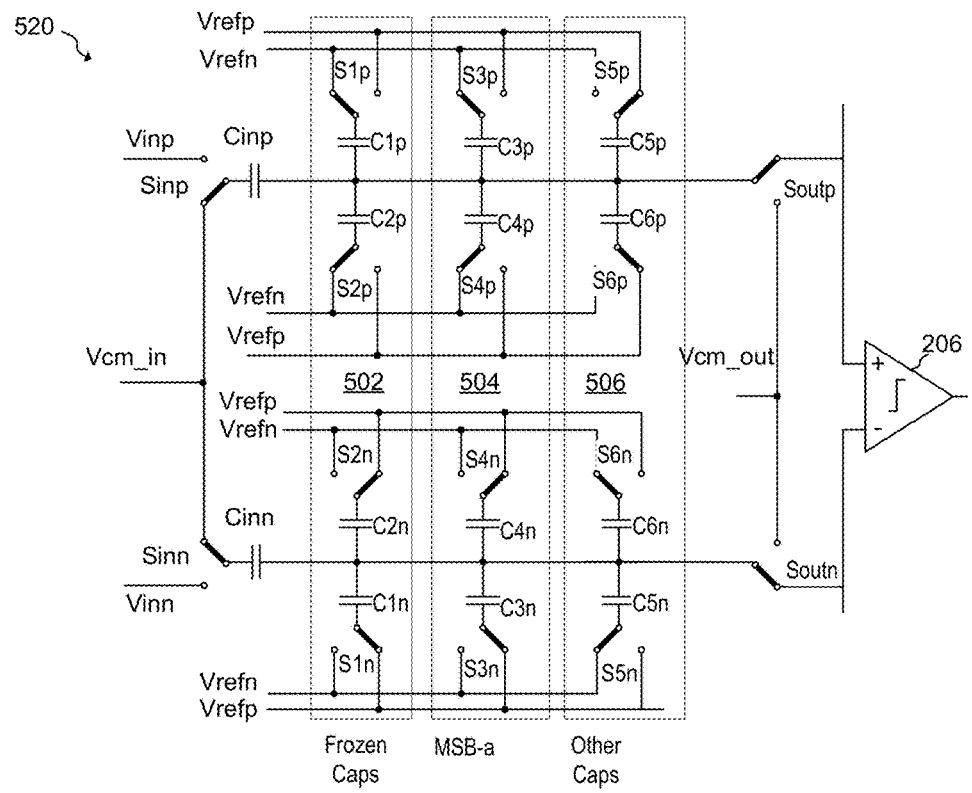

FIGS. 5A and 5B illustrate capacitor array sampling phase configurations according to an alternative embodiment. FIG. 5A illustrates a simplified schematic 500 representing a portion of SAR ADC in a first or "Type 1" sampling configuration. Capacitor array subset 502 represents array capacitors and switches that correspond to bits that are set to a predefined configuration during sampling and "frozen" during the recalibration phase; capacitor array subset 504 corresponds to the array capacitors and switches for the bit being measured (e.g., MSB-a), and capacitor array subset 506 corresponds to the other capacitors in the array.

With respect to the capacitor array subset 502 (corresponding to bits that are designated to be "frozen" during the redistribution phase), during the sampling phase, the bottom plates of capacitors C1$p$ and C2$p$ are coupled to reference voltage Vrefp via respective switches, S1$p$ and S2$p$, while the bottom plates of capacitors C1$n$ and C2$n$ are coupled to reference voltage Vrefn via respective switches C1$n$ and C2$n$. In capacitor array subset 504 corresponding to the bit being tested (e.g., MSB-a), the bottom plates of capacitors C3$p$ and C4$p$ are coupled to reference voltage Vrefp via respective switches, S3$p$ and S4$p$, while the bottom plates of capacitors C3$n$ and C4$n$ are coupled to reference voltage Vrefn via switches S3$n$ and S4$n$. Lastly, in capacitor array subset 506 corresponding to the remaining bits, the bottom plates of capacitors C5$p$ and C6$p$ are coupled to reference voltage Vrefn via respective switches, S5$p$ and S6$p$, while the bottom plates of capacitors C5$n$ and C6$n$ are coupled to reference voltage Vrefp via switches S5$n$ and S6$n$. By selecting the additional capacitors of capacitor array subset 502 and "freezing" them during the redistribution phase, a more symmetric state of the DAC can be achieved during the sampling phase.

FIG. 5B illustrates a simplified schematic 520 representing a portion of SAR ADC in a second or "Type 2" sampling configuration. Here the switch positions for the bottom plates of the array capacitors are swapped with respect to the simplified schematic of FIG. 5A. The bottoms plates of capacitors that are connected to reference voltage Vrefp in FIG. 5A are connected to reference voltage Vrefn in FIG. 5B, while the bottom plates of capacitors that are connected to reference voltage Vrefn in FIG. 5A are connected to reference voltage Vrefp in FIG. 5B.

The table of FIG. 5C represents an embodiment sampling configuration that may be used with the embodiment switching scheme of FIGS. 5A and 5B. FIG. 5C details the number of unit capacitors having bottom plates coupled to Vrefp for the upper capacitor array of SAR ADC 200 shown in FIG. 2B during the sampling phase of various respective weight measurements when the embodiment sampling configuration shown in FIG. 5A is used. In this case, capacitors corresponding to a plurality of bits are selected during the sampling phase.

For example, when the $7^{th}$ bit is being tested (e.g., MSB-5), a total of 256 unit capacitors of the upper array are coupled to reference voltage Vrefp, including 222 unit capacitors associated with the MSB (e.g., MSB-2), 22 unit capacitors associated with the $8^{th}$ bit (e.g., MSB-4), and the 12 unit capacitors associated with the 7th bit (e.g., MSB-5). Accordingly, there is no imbalance for the $7^{th}$ bit.

All connections to the bottom plates of capacitor array subset 502 remain in the same configuration during both the sampling phase and the redistribution phase. During the redistribution phase, the outputs of SAR 108 corresponding to the bits associated with the capacitors of capacitor array subset 502 are ignored and/or successive approximation cycles associated with these bits are omitted. Accordingly, the weight of the bit to be tested (e.g., MSB-a) is approximated using the bits associated with the capacitors of capacitor array subset 506.

In some embodiments, the weights of different combinations of bits are measured and the weight of each individual bit is determined by solving a system of linear equations. In such embodiments, groups of capacitors corresponding to multiple bits are selected during the sampling phase, but no capacitors are "frozen" during the redistribution phase. In other words, once the sampling phase has been completed, a nominal redistribution phase, such as the redistribution phase detailed in FIGS. 2D and 2E described above, is performed in which no bits are frozen. In other words, each bit is tested and no redistribution cycles are ignored.

The table of FIG. 5D represents a sampling configuration that could be used with the embodiment switch configurations shown in FIGS. 5A and 5B during the sampling phase in order to measure the weights in this manner. For example, in the configuration corresponding the column labeled "calib MSBm5," the weights of bits 7, 8 and 12 are measured; in the configuration corresponding the column labeled "calib MSBm4," the weights of bits 8, 9, 10 and 11 are measured; in the configuration corresponding the column labeled "calib MSBm3," the weights of bits 9, 10 and 11 are measured; in the configuration corresponding the column labeled "calib MSBm2," the weights of bits 10 and 11 are measured; in the configuration corresponding the column labeled "calib MSBm1," the weights of bits 11 and 12 are measured; and in the configuration corresponding the column labeled "calib MSBm0," the weight of bit 12 is measured. Once each group of weights is measured, each individual weight is determined by solving a system of linear equations.

In various embodiments, the sampling and redistribution phases are repeated multiple times using both the "Type 1" configuration of FIG. 5A and the "Type 2" configuration of FIG. 5B as explained with respect to the embodiment of FIGS. 3A and 3B.

It should be appreciated that the specific capacitor and weight measurement configurations described about with respect to FIGS. 5A-5D are just a few illustrative examples of many possible suitable embodiment capacitor measurement configuration and methods. In alternative embodiments, other configurations and weight combinations could be used depending on the specific embodiment and its implementations. The determination of which weights to select during the sampling phase may be adapted to the particular measurement scenario and may be affected by the number of bits of the ADC, the required accuracy of the ADC, and other implementation details of the system.

Figure 6:
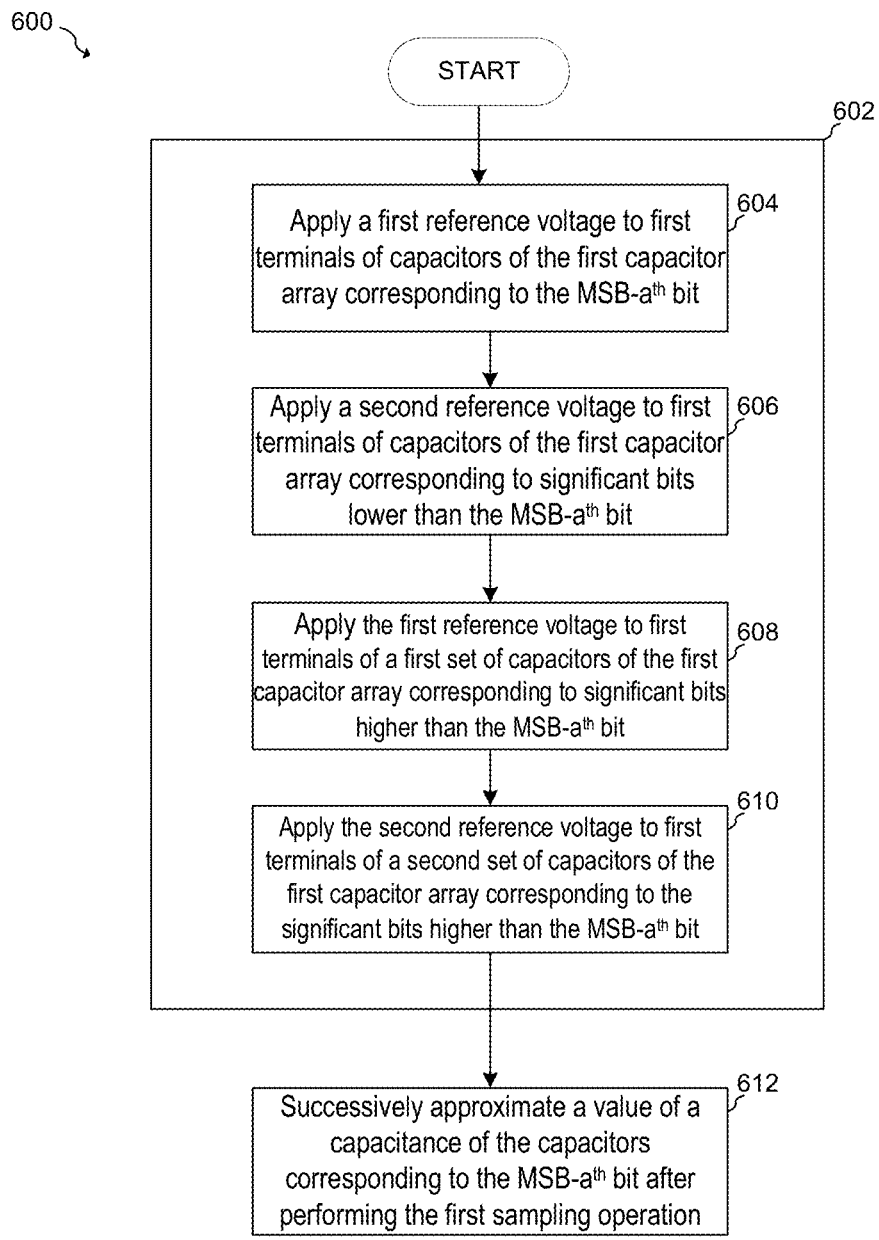
FIG. 6 illustrates a block diagram of an embodiment method.

FIG. 6 illustrates a flowchart of an embodiment method 600 of operating a successive approximation ADC having a first capacitor array. In particular, the steps illustrated in FIG. 6 are directed to measuring a first weight of an MSB-a$^{th}$ bit of the ADC. In step 602, a first sampling operation is performed. This sampling operation includes sub-steps 604, 606, 608 and 610. In sub-step 604, a first reference voltage is applied to first terminals of capacitors of the first capacitor array corresponding to the MSB-a$^{th}$ bit. This step may be implemented, for example, by applying voltage Vrefp to the bottom plates of capacitors C3p and C4p as shown in FIG. 3A or by applying voltage Vrefn to the bottom plates of capacitors C3p and C4P as shown in FIG. 3B. In sub-step 606, a second reference voltage is applied to first terminals of capacitors of the first capacitor array corresponding to significant bits lower than the MSB-$a^{th}$ bit. This step may be implemented, for example, by applying voltage Vrefn to the bottom plates of capacitors C5p and C6p as shown in FIG. 3A or by applying voltage Vrefp to the bottom plates of capacitors C5p and C6p as shown in FIG. 3B.

In sub-step 608, the first reference voltage is applied to first terminals of a first set of capacitors of the first capacitor array corresponding to significant bits higher than the MSB-$a^{th}$ bit, and in sub-step 610, the second reference voltage is applied to the terminals of a second set of capacitors of the first capacitor array corresponding to the significant bits higher than the MSB-$a^{th}$ bit. These steps may be implemented, for example, by applying voltage Vrefp to the bottom plate of capacitor C1p and voltage Vrefn to the bottom plate of capacitor C2p as shown in FIG. 3A, or by applying voltage Vrefn to the bottom plate of capacitor C1p and voltage Vrefp to the bottom plate of capacitor C2p as shown in FIG. 3B.

Next, in step 612, a value of a capacitance of the capacitors corresponding to the MSB-$a^{th}$ bit is successively approximated after performing the first sampling operation.

Embodiment successive approximation ADCs utilizing embodiment calibration circuits and methods may be applied to a wide variety of different systems and applications. One example of such a system is a radio frequency receiver, such as radio frequency receiver 700 illustrated in FIG. 7A. As shown, radio frequency receiver 700 includes an RF signal path having antenna 702, low noise amplifier 704, mixer 706, programmable gain amplifier 708, filter 710, embodiment successive approximation ADC 712, and processor 714. During operation, a radio frequency signal received by antenna 702 is amplified by low noise amplifier 704. Mixer 706 performs a downconversion which translates the frequency of the received radio frequency signal to an intermediate frequency or to a baseband frequency. The output of mixer 706 is amplified by programmable gain amplifier 708, and the output of programmable gain amplifier 708 is filtered by filter 710. The filtering provided by filter 710 may be used to reject out of band frequency content and/or serve as an anti-aliasing filter for successive approximation ADC 712. Successive approximation ADC 712 may be implemented, for example, using embodiment calibrated successive approximation ADC circuits and systems described herein. For example, the ADC shown in FIGS. 1, 2A and 2F and utilizing embodiment calibration methods described herein may be used to implement successive approximation ADC 712. Processor 714 may perform signal processing on the output of successive approximation ADC 712.

Figure 7A:
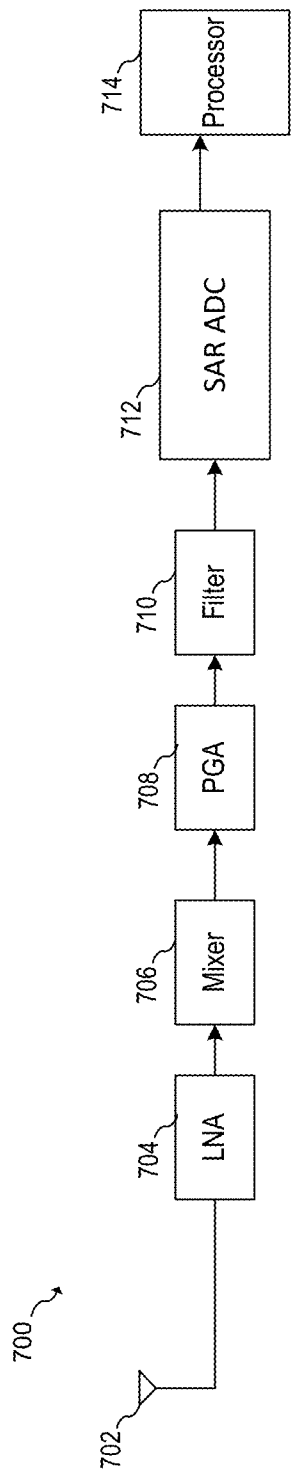
FIG. 7A illustrates an embodiment radio frequency receiver that includes an embodiment successive approximation ADC.

In various embodiments, radio frequency receiver 700 may be used in a wide variety of radio frequency-based systems. For example, radio frequency receiver 700 may be used as the receive signal path for a cellular telephone, or other wireless device. Radio frequency receiver 700, may also be used, for example, in a radar system, such as a millimeter-wave radar system. In the case of a radar system, the improvement in linearity afforded by the use of an embodiment successive approximation ADC 712 may result in improved SFDR as described with respect to embodiments above. It should be understood, however, that the architecture of radio frequency receiver 700 illustrated in FIG. 7A is just one example of many possible radio frequency receiver implementations that may be implemented using embodiment successive approximation ADCs.

Figure 7B:
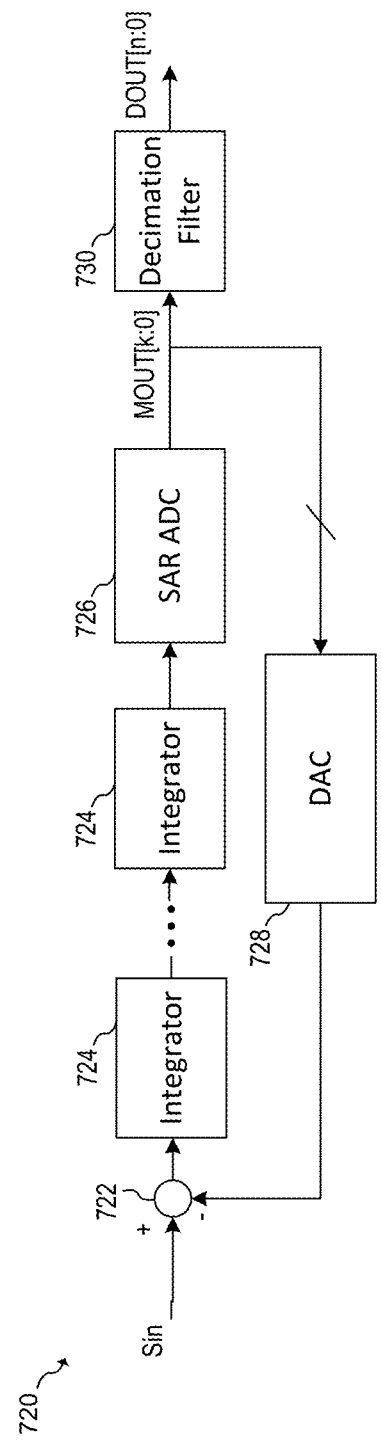
FIG. 7B illustrates an embodiment sigma delta ADC that includes an embodiment successive approximation ADC as a multi-level comparator.

Embodiment redundant successive approximation ADCs may also be used as a subcomponent in other data conversion systems. For example, an embodiment redundant successive approximation ADC could be used as a multilevel comparator in the implementation of a Sigma Delta ADC, such as is illustrated in FIG. 7B. Turning to FIG. 7B, an embodiment Sigma Delta ADC 720 is shown, which includes subtraction circuit 722, integrators 724, embodiment redundant successive approximation ADC 726, successive approximation ADC 712, and decimation filter 730.

In various embodiments, a multi-bit Sigma Delta modulator is formed using integrator 724, successive approximation ADC 726, DAC 728 and subtraction circuit 722. During operation, integrator 724 integrates the difference between inputs signal Sin and the output of DAC 728. This integrated difference is evaluated by successive approximation ADC 726, which functions as a multibit comparator. The output of successive approximation ADC 726 is input into DAC 728. Operation of the modulator operates according to Sigma Delta modulator principles known in the art. While only two integrators 724 are shown for ease of illustration, more than two integrators 724 may be used in order to implement a higher order Sigma Delta modulator.

Integrator 724 may be implemented, for example, using switch capacitor integrator structures known in the art, or may be implemented using continuous time integrators. DAC 628 may be implemented using DAC circuits and systems known in the art.

Decimation filter 730 may be used to reduce the sample rate of the modulator output, as well as increasing the bit width of the output. Decimation filter 730 may be implemented, for example, using decimation filter architectures known in the art. For example, decimation filter 730 may include a comb filter implemented using a cascade of accumulators followed by a cascade of difference circuits. An IIR filter or a FIR filter may also be used to provide further filtering. Alternatively, other filter structures may be used. It should be understood that Sigma Delta ADC 620 illustrated in FIG. 7B is just one of many example Sigma Delta ADC structures that may be used in conjunction with embodiment redundant successive approximation ADC circuits and systems known in the art. Advantageously, Sigma Delta ADCs that utilize embodiment redundant successive approximation ADC circuits may achieve a higher overall resolution due to the improved linearity of the SAR ADC.

Embodiment redundant successive approximation ADCs may also be used as general-purpose ADCs and included in a wide variety of electronic systems, for example, to convert ac or dc currents and/or voltages.

Embodiments of the present invention are summarized here. Other embodiments can also be understood from the entirety of the specification and the claims filed herein.

Example 1. A method for operating a successive approximation ADC including a first capacitor array, the method including: measuring a first weight of an MSB-$a^{th}$ bit of the ADC, including: performing a first sampling operation including: applying a first reference voltage to first terminals of capacitors of the first capacitor array corresponding to the MSB-$a^{th}$ bit, applying a second reference voltage to first terminals of capacitors of the first capacitor array corresponding to significant bits lower than the MSB-$a^{th}$ bit, applying the first reference voltage to first terminals of a first set of capacitors of the first capacitor array corresponding to significant bits higher than the MSB-$a^{th}$ bit, and applying the second reference voltage to first terminals of a second set of capacitors of the first capacitor array corresponding to the significant bits higher than the MSB-$a^{th}$ bit; and successively approximating a weight of a capacitance of the capacitors corresponding to the MSB-$a^{th}$ bit after performing the first sampling operation.

Example 2. The method of example 1, where successively approximating the weight of the capacitance of the capacitors corresponding to the MSB-$a^{th}$ bit includes determining the weight of the capacitance of the capacitors corresponding to the MSB-$a^{th}$ bit based only on the capacitors of the first capacitor array corresponding to the significant bits lower than the MSB-$a^{th}$ bit.

Example 3. The method of one of examples 1 or 2, where performing the first sampling operation further includes: applying the first reference voltage to first terminals of a third set of capacitors of the first capacitor array corresponding to at least one of the significant bits lower than the MSB-$a^{th}$ bit, applying the second reference voltage to first terminals of a fourth set of capacitors of the first capacitor array corresponding to the at least one of the significant bits lower than the MSB-$a^{th}$ bit, where successively approximating the weight of the capacitance of the capacitors corresponding to the MSB-$a^{th}$ bit includes determining the weight of the capacitance of the capacitors corresponding to the MSB-$a^{th}$ bit based only on the capacitors of the first capacitor array corresponding to the significant bits lower than the MSB-$a^{th}$ bit that are not in the third set of capacitors or in the fourth set of capacitors.

Example 4. The method of one of examples 1 to 3, where calibrating the MSB-$a^{th}$ bit of the ADC further includes: measuring a second weight of the MSB-$a^{th}$ bit of the ADC, including: performing a second sampling operation including: applying the second reference voltage to the first terminals of the capacitors of the first capacitor array corresponding to the MSB-$a^{th}$ bit, applying the first reference voltage to the first terminals of the capacitors of the first capacitor array corresponding to the significant bits lower than the MSB-$a^{th}$ bit, applying the first reference voltage to the first terminals of the first set of the capacitors of the first capacitor array corresponding the significant bits higher than the MSB-$a^{th}$ bit, and applying the second reference voltage to the first terminals of the second set of capacitors of the first capacitor array corresponding to the significant bits higher than the MSB-$a^{th}$ bit, and successively approximating a weight of a capacitance of the capacitors corresponding to the MSB-$a^{th}$ bit after performing the second sampling operation.

Example 5. The method of example 4, where performing the second sampling operation further includes: applying the second reference voltage to first terminals of a third set of capacitors of the first capacitor array corresponding to at least one of the significant bits lower than the MSB-$a^{th}$ bit, applying the first reference voltage to first terminals of a fourth set of capacitors of the first capacitor array corresponding to the at least one of the significant bits lower than the MSB-$a^{th}$ bit, where successively approximating the weight of the capacitance of the capacitors corresponding to the MSB-$a^{th}$ bit includes determining the weight of the capacitance of the capacitors corresponding to the MSB-$a^{th}$ bit based only on the capacitors of the first capacitor array corresponding to the significant bits lower than the MSB-$a^{th}$ bit that are not in the third set of capacitors or in the fourth set of capacitors.

Example 6. The method of example 4 or 5, further including calibrating the MSB-$a^{th}$ bit of the ADC, including: performing the step of measuring the first weight of the MSB-$a^{th}$ bit of the ADC a first number of times to obtain a first set of capacitance weights; performing the step of measuring the second weight of the MSB-$a^{th}$ bit of the ADC the first number of times to obtain a second set of capacitance weights; averaging the first set of capacitance weights and the second set of capacitance weights to obtain an averaged value; and writing the averaged value to a memory.

Example 7. The method of example 6, further including calibrating the ADC, including performing the step of calibrating the MSB-$a^{th}$ bit of the ADC for a plurality of values of a.

Example 8. The method of one of examples 1 to 7 where: the successive approximation ADC further includes a second capacitor array; and performing the first weight of the MSB-$a^{th}$ bit of the ADC further includes: applying the second reference voltage to first terminals of capacitors of the second capacitor array corresponding to the MSB-$a^{th}$ bit, applying the first reference voltage to first terminals of capacitors of the second capacitor array corresponding to the significant bits lower than the MSB-$a^{th}$ bit, applying the first reference voltage to first terminals of a first set of capacitors of the second capacitor array corresponding to the significant bits higher than the MSB-$a^{th}$ bit, and applying the second reference voltage to first terminals of a second set of capacitors of the second capacitor array corresponding to the significant bits higher than the MSB-$a^{th}$ bit.

Example 9. The method of one of examples 1 to 8, where the first capacitor array is a sub-binary weighted capacitor array.

Example 10. A method for operating a successive approximation ADC including a first capacitor array, the method including: measuring a first weight of an MSB-$a^{th}$ bit of the ADC, including: performing a first sampling operation including: applying a first reference voltage to first terminals of capacitors of the first capacitor array corresponding to the MSB-$a^{th}$ bit, applying the first reference voltage to first terminals of a first set of capacitors of the first capacitor array corresponding to other bits besides the MSB-$a^{th}$ bit, and applying a second reference voltage to first terminals of a second set of capacitors of the first capacitor array corresponding to other bits besides the MSB-$a^{th}$ bit; and successively approximating a weight of a capacitance of the capacitors corresponding to the MSB-$a^{th}$ bit after performing the first sampling operation while continuing to apply the first reference voltage to first terminals of a first set of capacitors of the first capacitor array corresponding to other bits besides the MSB-$a^{th}$ bit.

Example 11. The method of example 10, where a sum of the capacitance of the capacitors of the first capacitor array corresponding to the MSB-$a^{th}$ bit and a capacitance of the first set of capacitors is within 40% of a sum of the capacitance of the second set of capacitors.

Example 12. The method of one of examples 10 or 11, where the weight of the capacitance of the capacitors of corresponding to the MSB-$a^{th}$ bit is approximated on the basis of the second set of capacitors.

Example 13. The method of one of examples 9 to 12, where a sum of the capacitance of the capacitors of the first capacitor array corresponding to the MSB-$a^{th}$ bit and a capacitance of the first set of capacitors is selected to minimize an error of the measured first weight.

Example 14. A method for operating a successive approximation ADC including a first capacitor array, the method including: measuring a plurality of capacitances of the ADC, where each capacitance corresponds to a different combination of bits of the ADC, and measuring each capacitance of the plurality of capacitances includes applying a first reference voltage to first terminals of capacitors of the first capacitor array corresponding to a plurality of bits of the ADC corresponding to the respective combination of bits, and applying a second reference voltage to first terminals of capacitors of the first capacitor array that do not correspond the plurality of bits of the ADC corresponding to the respective combination of bits; successively approximating a capacitance of the capacitors of the first capacitor array corresponding to the plurality of bits of the ADC corresponding to the respective combination of bits; and calculating a capacitance weight corresponding to each bit of the ADC based on the measured plurality of capacitances.

Example 15. The method of example 14, where calculating the capacitance weight includes solving a system of linear equations describing a relationship between each respective combination of bits and its measured capacitance.

Example 16. An analog-to-digital converter (ADC) including: a first capacitor array; a plurality of switches coupled to the first capacitor array; a comparator coupled to the first capacitor array; and a controller including a successive approximation register and configured to measure a first weight of an MSB-$a^{th}$ bit of the ADC by configuring the first capacitor array in a first sampling configuration in which a first reference voltage is coupled to first terminals of capacitors of the first capacitor array corresponding to the MSB-$a^{th}$ bit, and to first terminals of a first set of capacitors of the first capacitor array corresponding to significant bits higher than the MSB-$a^{th}$ bit, and a second reference voltage is coupled to first terminals of capacitors of the first capacitor array corresponding to significant bits lower than the MSB-$a^{th}$ bit, and to first terminals of a second set of capacitors of the first capacitor array corresponding to the significant bits higher than the MSB-$a^{th}$ bit, and successively approximating a weight of a capacitance of the capacitors corresponding to the MSB-$a^{th}$ bit based on feedback from the comparator after the first capacitor array has been arranged in the first sampling configuration to obtain a first capacitance weight.

Example 17. The ADC of example 16, where: in the first sampling configuration, the first reference voltage is further coupled to first terminals of a third set of capacitors of the first capacitor array corresponding to at least one of the significant bits lower than the MSB-$a^{th}$ bit, the second reference voltage is further coupled to first terminals of a fourth set of capacitors of the first capacitor array corresponding to the at least one of the significant bits lower than the MSB-$a^{th}$ bit, the controller is configured to successively approximate the weight of a capacitance of the capacitors corresponding to the MSB-$a^{th}$ bit includes by ignoring feedback from the comparator for the at least one of the significant bits lower than the MSB-$a^{th}$ bit to obtain a first capacitance weight; and determining the weight of the capacitance of the capacitors corresponding to the MSB-$a^{th}$ bit based only on the capacitors of the first capacitor array corresponding to the significant bits lower than the MSB-$a^{th}$ bit that are not in the third set of capacitors or in the fourth set of capacitors.

Example 18. The ADC of one of examples 16 or 17, further including a second capacitor array, where, in the first sampling configuration: the second reference voltage is coupled to first terminals of capacitors of the second capacitor array corresponding to the MSB-$a^{th}$ bit, and to first terminals of a first set of capacitors of the second capacitor array corresponding to the significant bits higher than the MSB-$a^{th}$ bit; and the first reference voltage is coupled to first terminals of capacitors of the second capacitor array corresponding to the significant bits lower than the MSB-$a^{th}$ bit, and to first terminals of a second set of capacitors of the second capacitor array corresponding to the significant bits higher than the MSB-$a^{th}$ bit.

Example 19. The ADC of one of examples 16 to 18, where the controller is further configured to: configure the first capacitor array in a second sampling configuration in which: the second reference voltage is coupled to first terminals of capacitors of the first capacitor array corresponding to the MSB-$a^{th}$ bit, and to first terminals of a first set of capacitors of the first capacitor array corresponding to the significant bits higher than the MSB-$a^{th}$ bit, the first reference voltage is coupled to first terminals of capacitors of the first capacitor array corresponding to the significant bits lower than the MSB-$a^{th}$ bit, and to first terminals of a second set of capacitors of the first capacitor array corresponding to the significant bits higher than the MSB-$a^{th}$ bit; and successively approximate a weight of a capacitance of the capacitors corresponding to the MSB-$a^{th}$ bit based on feedback from the comparator after the first capacitor array has been arranged in the second sampling configuration to obtain a second capacitance weight.

Example 20. The ADC of one of examples 16 to 19, where the controller is further configured to average the first capacitance weight and the second capacitance weight to obtain an averaged capacitance weight.

Example 21. The ADC of one of examples 16 to 20, where: the ADC further includes a mapping circuit coupled to an output of the successive approximation register; and the controller is configured to write a code corresponding to the averaged capacitance weight to a memory location of the mapping circuit corresponding to the MSB-$a^{th}$ bit of the ADC.

Example 22. The ADC of one of examples 16 to 21, where the first capacitor array is a sub-binary weighed capacitor array.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for operating a successive approximation ADC comprising a first capacitor array, the method comprising:
   measuring a first weight of an MSB-$a^{th}$ bit of the ADC, wherein a=0 to n−2 and n is a number of bits of the successive approximation ADC, and measuring the first weight comprises:
   performing a first sampling operation comprising:
   applying a first reference voltage to first terminals of capacitors of the first capacitor array corresponding to the MSB-$a^{th}$ bit,
   applying a second reference voltage to first terminals of capacitors of the first capacitor array corresponding to significant bits lower than the MSB-$a^{th}$ bit,
   applying the first reference voltage to first terminals of a first set of capacitors of the first capacitor array corresponding to significant bits higher than the MSB-$a^{th}$ bit, and
   applying the second reference voltage to first terminals of a second set of capacitors of the first capacitor array corresponding to the significant bits higher than the MSB-$a^{th}$ bit; and successively approximating a weight of a capacitance of the capacitors corresponding to the MSB-$a^{th}$ bit after performing the first sampling operation.

2. The method of claim 1, wherein successively approximating the weight of the capacitance of the capacitors corresponding to the MSB-$a^{th}$ bit comprises determining the weight of the capacitance of the capacitors corresponding to the MSB-$a^{th}$ bit based only on the capacitors of the first capacitor array corresponding to the significant bits lower than the MSB-$a^{th}$ bit.

3. The method of claim 1, wherein performing the first sampling operation further comprises:
 applying the first reference voltage to first terminals of a third set of capacitors of the first capacitor array corresponding to at least one of the significant bits lower than the MSB-$a^{th}$ bit,
 applying the second reference voltage to first terminals of a fourth set of capacitors of the first capacitor array corresponding to the at least one of the significant bits lower than the MSB-$a^{th}$ bit, wherein successively approximating the weight of the capacitance of the capacitors corresponding to the MSB-$a^{th}$ bit comprises determining the weight of the capacitance of the capacitors corresponding to the MSB-$a^{th}$ bit based only on the capacitors of the first capacitor array corresponding to the significant bits lower than the MSB-$a^{th}$ bit that are not in the third set of capacitors or in the fourth set of capacitors.

4. The method of claim 1, wherein calibrating the MSB-$a^{th}$ bit of the ADC further comprises:
 measuring a second weight of the MSB-$a^{th}$ bit of the ADC, comprising:
  performing a second sampling operation comprising:
   applying the second reference voltage to the first terminals of the capacitors of the first capacitor array corresponding to the MSB-$a^{th}$ bit,
   applying the first reference voltage to the first terminals of the capacitors of the first capacitor array corresponding to the significant bits lower than the MSB-$a^{th}$ bit,
   applying the first reference voltage to the first terminals of the first set of the capacitors of the first capacitor array corresponding the significant bits higher than the MSB-$a^{th}$ bit, and
   applying the second reference voltage to the first terminals of the second set of capacitors of the first capacitor array corresponding to the significant bits higher than the MSB-$a^{th}$ bit, and
  successively approximating a weight of a capacitance of the capacitors corresponding to the MSB-$a^{th}$ bit after performing the second sampling operation.

5. The method of claim 4, wherein performing the second sampling operation further comprises:
 applying the second reference voltage to first terminals of a third set of capacitors of the first capacitor array corresponding to at least one of the significant bits lower than the MSB-$a^{th}$ bit,
 applying the first reference voltage to first terminals of a fourth set of capacitors of the first capacitor array corresponding to the at least one of the significant bits lower than the MSB-$a^{th}$ bit, wherein successively approximating the weight of the capacitance of the capacitors corresponding to the MSB-$a^{th}$ bit comprises determining the weight of the capacitance of the capacitors corresponding to the MSB-$a^{th}$ bit based only on the capacitors of the first capacitor array corresponding to the significant bits lower than the MSB-$a^{th}$ bit that are not in the third set of capacitors or in the fourth set of capacitors.

6. The method of claim 4, further comprising calibrating the MSB-$a^{th}$ bit of the ADC, comprising:
 performing the step of measuring the first weight of the MSB-$a^{th}$ bit of the ADC a first number of times to obtain a first set of capacitance weights;
 performing the step of measuring the second weight of the MSB-$a^{th}$ bit of the ADC the first number of times to obtain a second set of capacitance weights;
 averaging the first set of capacitance weights and the second set of capacitance weights to obtain an averaged value; and
 writing the averaged value to a memory.

7. The method of claim 6, further comprising calibrating the ADC, comprising performing the step of calibrating the MSB-$a^{th}$ bit of the ADC for a plurality of values of a.

8. The method of claim 1 wherein:
 the successive approximation ADC further comprises a second capacitor array; and
 performing the first weight of the MSB-$a^{th}$ bit of the ADC further comprises:
  applying the second reference voltage to first terminals of capacitors of the second capacitor array corresponding to the MSB-$a^{th}$ bit,
  applying the first reference voltage to first terminals of capacitors of the second capacitor array corresponding to the significant bits lower than the MSB-$a^{th}$ bit,
  applying the first reference voltage to first terminals of a first set of capacitors of the second capacitor array corresponding to the significant bits higher than the MSB-$a^{th}$ bit, and
  applying the second reference voltage to first terminals of a second set of capacitors of the second capacitor array corresponding to the significant bits higher than the MSB-$a^{th}$ bit.

9. The method of claim 1, wherein the first capacitor array is a sub-binary weighted capacitor array.

10. A method for operating a successive approximation ADC comprising a first capacitor array, the method comprising:
 measuring a first weight of an MSB-$a^{th}$ bit of the ADC, wherein a=0 to n−2 and n is a number of bits of the successive approximation ADC, and measuring the first weight comprises:
  performing a first sampling operation comprising:
   applying a first reference voltage to first terminals of capacitors of the first capacitor array corresponding to the MSB-$a^{th}$ bit,
   applying the first reference voltage to first terminals of a first set of capacitors of the first capacitor array corresponding to other bits besides the MSB-$a^{th}$ bit, and
   applying a second reference voltage to first terminals of a second set of capacitors of the first capacitor array corresponding to other bits besides the MSB-$a^{th}$ bit; and
  successively approximating a weight of a capacitance of the capacitors corresponding to the MSB-$a^{th}$ bit after performing the first sampling operation while continuing to apply the first reference voltage to first terminals of a first set of capacitors of the first capacitor array corresponding to other bits besides the MSB-$a^{th}$ bit.

11. The method of claim 10, wherein a sum of the capacitance of the capacitors of the first capacitor array corresponding to the MSB-$a^{th}$ bit and a capacitance of the first set of capacitors is within 40% of a sum of the capacitance of the second set of capacitors.

12. The method of claim 10, wherein a sum of the capacitance of the capacitors of the first capacitor array corresponding to the MSB-$a^{th}$ bit and a capacitance of the first set of capacitors is selected to minimize an error of the measured first weight.

13. The method of claim 10, wherein the weight of the capacitance of the capacitors of corresponding to the MSB-$a^{th}$ bit is approximated on the basis of the second set of capacitors.

14. A method for operating a successive approximation ADC comprising a first capacitor array, the method comprising:
    measuring a plurality of capacitances of the ADC, wherein each capacitance corresponds to a different combination of bits of the ADC, and measuring each capacitance of the plurality of capacitances comprises
        applying a first reference voltage to first terminals of capacitors of the first capacitor array corresponding to a plurality of bits of the ADC corresponding to the respective combination of bits, and
        applying a second reference voltage to first terminals of capacitors of the first capacitor array that do not correspond the plurality of bits of the ADC corresponding to the respective combination of bits;
    successively approximating a capacitance of the capacitors of the first capacitor array corresponding to the plurality of bits of the ADC corresponding to the respective combination of bits; and
    calculating a capacitance weight corresponding to each bit of the ADC based on the measured plurality of capacitances.

15. The method of claim 14, wherein calculating the capacitance weight comprises solving a system of linear equations describing a relationship between each respective combination of bits and its measured capacitance.

16. An analog-to-digital converter (ADC) comprising:
    a first capacitor array;
    a plurality of switches coupled to the first capacitor array;
    a comparator coupled to the first capacitor array; and
    a controller comprising a successive approximation register and configured to measure a first weight of an MSB-$a^{th}$ bit of the ADC by
        configuring the first capacitor array in a first sampling configuration in which
            a first reference voltage is coupled to first terminals of capacitors of the first capacitor array corresponding to the MSB-$a^{th}$ bit, and to first terminals of a first set of capacitors of the first capacitor array corresponding to significant bits higher than the MSB-$a^{th}$ bit, and
            a second reference voltage is coupled to first terminals of capacitors of the first capacitor array corresponding to significant bits lower than the MSB-$a^{th}$ bit, and to first terminals of a second set of capacitors of the first capacitor array corresponding to the significant bits higher than the MSB-$a^{th}$ bit, and
        successively approximating a weight of a capacitance of the capacitors corresponding to the MSB-$a^{th}$ bit based on feedback from the comparator after the first capacitor array has been arranged in the first sampling configuration to obtain a first capacitance weight, wherein a=0 to n−2 and n is a number of bits of the successive approximation ADC.

17. The ADC of claim 16, wherein:
    in the first sampling configuration,
        the first reference voltage is further coupled to first terminals of a third set of capacitors of the first capacitor array corresponding to at least one of the significant bits lower than the MSB-$a^{th}$ bit,
        the second reference voltage is further coupled to first terminals of a fourth set of capacitors of the first capacitor array corresponding to the at least one of the significant bits lower than the MSB-$a^{th}$ bit,
    the controller is configured to successively approximate the weight of a capacitance of the capacitors corresponding to the MSB-$a^{th}$ bit comprises by ignoring feedback from the comparator for the at least one of the significant bits lower than the MSB-$a^{th}$ bit to obtain the first capacitance weight; and
    determining the weight of the capacitance of the capacitors corresponding to the MSB-$a^{th}$ bit based only on the capacitors of the first capacitor array corresponding to the significant bits lower than the MSB-$a^{th}$ bit that are not in the third set of capacitors or in the fourth set of capacitors.

18. The ADC of claim 16, further comprising a second capacitor array, wherein, in the first sampling configuration:
    the second reference voltage is coupled to first terminals of capacitors of the second capacitor array corresponding to the MSB-$a^{th}$ bit, and to first terminals of a first set of capacitors of the second capacitor array corresponding to the significant bits higher than the MSB-$a^{th}$ bit; and
    the first reference voltage is coupled to first terminals of capacitors of the second capacitor array corresponding to the significant bits lower than the MSB-$a^{th}$ bit, and to first terminals of a second set of capacitors of the second capacitor array corresponding to the significant bits higher than the MSB-$a^{th}$ bit.

19. The ADC of claim 16, wherein the controller is further configured to:
    configure the first capacitor array in a second sampling configuration in which:
        the second reference voltage is coupled to first terminals of capacitors of the first capacitor array corresponding to the MSB-$a^{th}$ bit, and to first terminals of a first set of capacitors of the first capacitor array corresponding to the significant bits higher than the MSB-$a^{th}$ bit,
        the first reference voltage is coupled to first terminals of capacitors of the first capacitor array corresponding to the significant bits lower than the MSB-$a^{th}$ bit, and to first terminals of a second set of capacitors of the first capacitor array corresponding to the significant bits higher than the MSB-$a^{th}$ bit; and
    successively approximate a weight of a capacitance of the capacitors corresponding to the MSB-$a^{th}$ bit based on feedback from the comparator after the first capacitor array has been arranged in the second sampling configuration to obtain a second capacitance weight.

20. The ADC of claim 19, wherein the controller is further configured to average the first capacitance weight and the second capacitance weight to obtain an averaged capacitance weight.

21. The ADC of claim 20, wherein:
    the ADC further comprises a mapping circuit coupled to an output of the successive approximation register; and
    the controller is configured to write a code corresponding to the averaged capacitance weight to a memory location of the mapping circuit corresponding to the MSB-$a^{th}$ bit of the ADC.

22. The ADC of claim 19, wherein the first capacitor array is a sub-binary weighed capacitor array.

\* \* \* \* \*

UNITED STATES PATENT AND TRADEMARK OFFICE
CERTIFICATE OF CORRECTION

PATENT NO.         : 12,199,628 B2
APPLICATION NO.    : 18/047896
DATED              : January 14, 2025
INVENTOR(S)        : Kanzian et al.

Page 1 of 1

It is certified that error appears in the above-identified patent and that said Letters Patent is hereby corrected as shown below:

In the Claims

In Column 29, Line 1 and 2, Claim 11:
Change "the capacitance of the second set of capacitors."
To --a capacitance of the second set of capacitors.--

In Column 29, Line 9, Claim 13:
Change "capacitance of the capacitors of corresponding to"
To --capacitance of the capacitors corresponding to--

In Column 29, Line 26, Claim 14:
Change "correspond the plurality of bits of the ADC"
To --correspond to the plurality of bits of the ADC--

Signed and Sealed this
First Day of April, 2025

Coke Morgan Stewart
*Acting Director of the United States Patent and Trademark Office*